US011164948B2

United States Patent
Ho et al.

(10) Patent No.: US 11,164,948 B2
(45) Date of Patent: Nov. 2, 2021

(54) FIELD-EFFECT TRANSISTOR AND METHOD OF MANUFACTURING THE SAME

(71) Applicant: Taiwan Semiconductor Manufacturing Co., Ltd., Hsinchu (TW)

(72) Inventors: Tsai-Jung Ho, Changhua County (TW); Jr-Hung Li, Hsinchu County (TW); Tze-Liang Lee, Hsinchu (TW); Pei-Yu Chou, Hsinchu County (TW); Chi-Ta Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 16/805,841

(22) Filed: Mar. 2, 2020

(65) Prior Publication Data

US 2021/0091191 A1      Mar. 25, 2021

Related U.S. Application Data

(60) Provisional application No. 62/905,376, filed on Sep. 24, 2019.

(51) Int. Cl.
| | |
|---|---|
| *H01L 29/417* | (2006.01) |
| *H01L 29/08* | (2006.01) |
| *H01L 29/78* | (2006.01) |
| *H01L 21/02* | (2006.01) |
| *H01L 21/311* | (2006.01) |

(52) U.S. Cl.
CPC .... *H01L 29/41791* (2013.01); *H01L 21/0217* (2013.01); *H01L 21/31116* (2013.01); *H01L 29/0847* (2013.01); *H01L 29/41775* (2013.01); *H01L 29/7851* (2013.01)

(58) Field of Classification Search
None
See application file for complete search history.

(56) References Cited

U.S. PATENT DOCUMENTS

| 2010/0001409 A1* | 1/2010 | Humbert | H01L 21/76825 257/774 |
| 2015/0048447 A1* | 2/2015 | Sharma | H01L 29/404 257/337 |
| 2017/0047418 A1* | 2/2017 | Fan | H01L 29/0649 |

\* cited by examiner

*Primary Examiner* — Anthony Ho
*Assistant Examiner* — Kevin Quinto
(74) *Attorney, Agent, or Firm* — JCIPRNET

(57) ABSTRACT

A field effect transistor includes a semiconductor substrate, source and drain regions, lower source and drain contacts, a metal gate, a first interlayer dielectric layer, a capping layer, and an etch stop layer. The source and drain regions are disposed on the semiconductor substrate. The lower source and drain contacts are disposed on the source and drain regions. The metal gate is disposed in between the lower source and drain contacts. The first interlayer dielectric layer encircles the metal gate and the lower source and drain contacts. The capping layer is disposed on the metal gate. The etch stop layer extends on the first interlayer dielectric layer. An etching selectivity for the etch stop layer over the capping layer is greater than 10.

20 Claims, 27 Drawing Sheets

FIELD-EFFECT TRANSISTOR AND METHOD OF MANUFACTURING THE SAME

CROSS-REFERENCE TO RELATED APPLICATION

This application claims the priority benefit of U.S. Provisional application Ser. No. 62/905,376, filed on Sep. 24, 2019. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Challenges from both fabrication and design issues have resulted in the development of three-dimensional designs, such as fin field-effect transistors (FinFETs).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 7A show schematic perspective views of the corresponding structures illustrated in FIG. 1 to FIG. 7.

DETAILED DESCRIPTION

Figure 1:
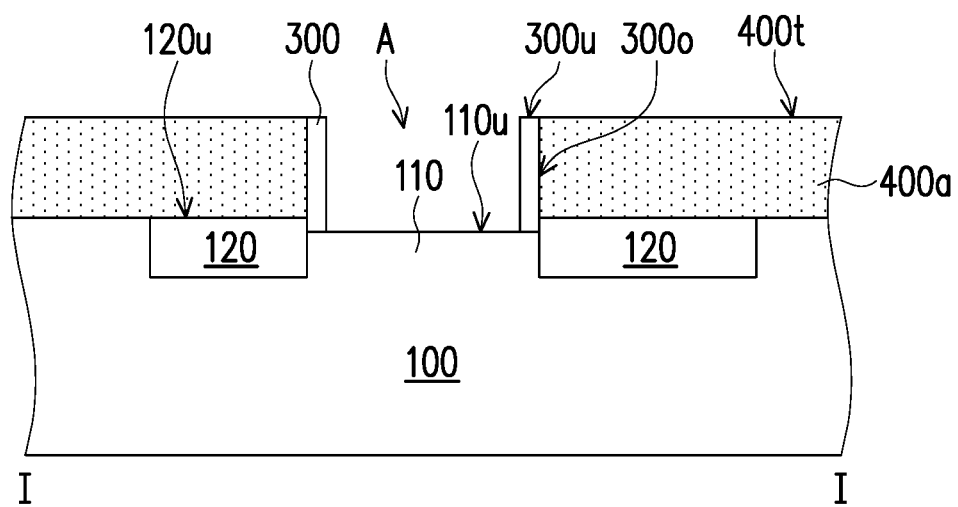
FIG. 1 to FIG. 15 show schematic cross-sectional views of structures produced during a manufacturing method of a FinFET according to some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature on or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the disclosure describe the exemplary manufacturing process of FinFETs and the FinFETs fabricated there-from. In certain embodiments of the disclosure, the FinFET may be formed on bulk silicon substrates. Still, the FinFET may be formed on a silicon-on-insulator (SOI) substrate, a germanium-on-insulator (GOI) substrate, a SiGe substrate, or a Group III-V semiconductor substrate. Also, in accordance with some embodiments of the disclosure, the silicon substrate may include other conductive layers or other semiconductor elements, such as transistors, diodes or the like. The embodiments are not limited in this context. Other transistor structures, such as but not limited to planar field effect transistors or gate-all-around (GAA) field effect transistors, are within the contemplated scope of the disclosure. The field effect transistor may be included in a microprocessor, memory cell, and/or other integrated circuits (IC). In addition, the transistors of the present disclosure may be further processed using CMOS technology processing. Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a field effect transistor, it is understood the field effect transistor may be part of an IC that further includes a number of other devices such as resistors, capacitors, inductors, fuses, etc.

FIG. 1 to FIG. 15 show schematic cross-sectional views of structures produced during a manufacturing method of a FinFET T10 according to some embodiments of the disclosure. FIG. 1A to FIG. 7A show schematic perspective views of the corresponding structures illustrated in FIG. 1 to FIG. 7. The cross-sectional views of FIG. 1 to FIG. 15 are taken along the line I-I illustrated in FIG. 1A, in correspondence of one of the fins 110. Referring to FIG. 1 and to FIG. 1A, a semiconductor substrate 100 is provided. In some embodiments, the semiconductor substrate 100 includes a crystalline silicon substrate or a bulk silicon substrate (e.g., wafer). The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the semiconductor substrate 100 may be made of a suitable elemental semiconductor, such as diamond or germanium; a suitable compound semiconductor, such as gallium arsenide, silicon carbide, silicon germanium, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate.

Figure 1A:
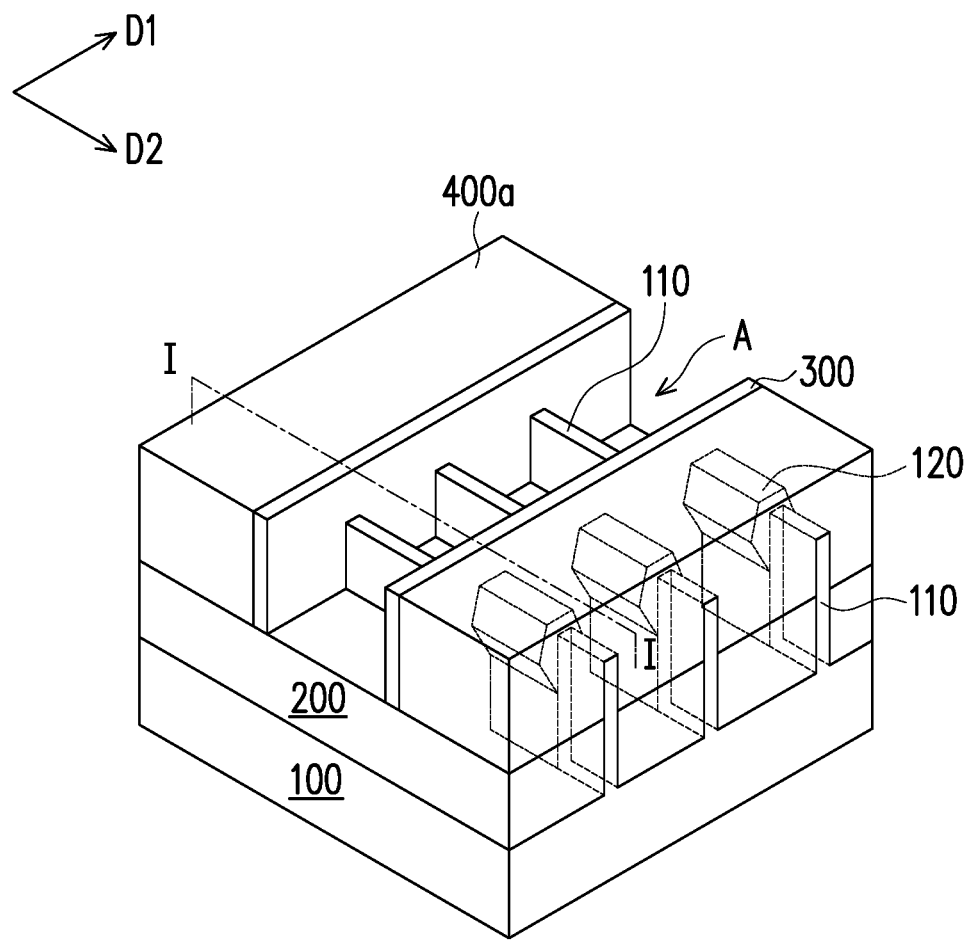

As shown in FIG. 1 and FIG. 1A, at least one fin 110 is formed on and/or in the semiconductor substrate 100. In some embodiments, portions of the semiconductor substrate 100 are removed to define the fins 110 protruding from the semiconductor substrate 100. In some embodiments, the semiconductor substrate 100 and the fins 110 are integrally formed, that is, there is no boundary between the semiconductor substrate 100 and the individual fins 110. However, other techniques for fabricating the fins 110 are possible. In some embodiments, the semiconductor substrate 100 and the fins 110 are made of a same material. In some embodiments, multiple fins 110 are arranged along a first direction D1. In some embodiments, for each of the fins 110 the width along a second direction D2 is larger than the thickness along the first direction DE where D1 and D2 are orthogonal with respect to each other. In some embodiments, a spacing of the fins 110 along the first direction D1 may be adjusted according to production and design requirements.

In some embodiments, as shown in FIG. 1, isolation structures 200 are formed between the fins 110. In some embodiments, the isolation structures 200 are shallow trench isolation (STI) structures. The isolation structures 200 are interposed between adjacent fins 110. The isolation structures 200 may be formed by filling a trench defined by adjacent fins 110 with a dielectric material. In some embodiments, the dielectric material may include silicon oxide, silicon nitride, silicon oxynitride, fluoride-doped silicate glass (FSG), a spin-on dielectric material, a low-k dielectric material, other suitable dielectric materials, or a combination thereof. In some embodiments, low-k dielectric materials are dielectric materials having a dielectric constant lower than 3.9. The isolation structures 200 may be formed by high-density-plasma chemical vapor deposition (HDP-CVD), sub-atmospheric CVD (SACVD) or by spin-on. In some embodiments, the isolation structures 200 may have a multi-layered structure, such as a thermal oxide liner layer filled with silicon nitride or silicon oxide. In some embodiments, the isolation structures 200 are formed by local oxidation of silicon (LOCOS).

In some embodiments, spacers 300 are formed on the isolation structures 200 and over the fins 110. Referring to FIG. 1 and FIG. 1A, the spacers 300 extends over multiple fins 110 along the first direction D1. In some embodiments, a pair of parallel spacers 300 delimits an enclosure A exposing a central portion of the fins 110. In some embodiments, the spacers 300 are formed of dielectric materials, such as silicon oxide, silicon nitride, carbonized silicon nitride (SiCN), SiCON, or a combination thereof. In some embodiments, the spacers 300 are a single-layered structure. In some alternative embodiments, the spacers 300 are a multi-layered structure. In some embodiments, the pair of parallel spacers 300 are connected at opposite line-ends and form a ring structure or an enclosed wall structure defining the enclosure A in which the fins 110 and the isolation structures 200 are exposed. It should be noted that whilst in FIG. 1 only three fins 110 are illustrated in the enclosure A, the disclosure is not limited by the number of fins 110 encircled by the spacers 300. In some alternative embodiments, more or fewer fins 110 may be exposed within the same enclosure A. In some embodiments, the enclosure A may be formed by removing a temporary dummy gate (not shown) formed during previous steps of the process. As shown in FIG. 1 and FIG. 1A, the source and drain regions 120 are located outside of the enclosure A defined by the spacers 300.

Referring to FIG. 1 and FIG. 1A, in some embodiments, the source and drain regions 120 of the transistor are formed in/on the fin 110 at opposite sides outside the spacers. In some embodiments, one of the two source and drain regions 120 at one side of the spacers 300 acts as a source region, and the other source and drain region 120 at the opposite side of the spacers 300 acts as a drain region. In some embodiments, the source and drain regions 120 are disposed in the fins 110. In some embodiments, a silicide layer (not shown) is selectively formed on an upper surface 120u of the source and drain regions 120. In some embodiments, the source and drain regions 120 are further epitaxially grown in recesses formed at the sides of the spacers 300 in each fin 110. In some embodiments, as shown in FIG. 1 and FIG. 1A, the source and drain regions 120 protrude with respect to the fins 110. That is, the upper surface 120u of a source and drain region 120 may be raised with respect to the upper surface 110u of the fin 110 in which the source and drain region 120 is formed. In some embodiments, the source and drain regions 120 may be epitaxially grown to have protruded shapes or diamond shapes. In some embodiments, a material of the source and drain regions 120 is different than a material of the fin 110 sandwiched in between. In some embodiments, the material of the source and drain regions 120 is doped with a conductive dopant. For example, a strained material, such as SiGe, is epitaxially grown with a p-type dopant for straining a p-type FinFET. That is, the strained material is doped with the p-type dopant to be the source and drain regions 120 of the p-type FinFET. The p-type dopant includes boron or $BF_2$, and the strained material may be epitaxially grown by LPCVD process with in-situ doping. In some alternative embodiments, the strained material, such as SiC, SiP, a combination of SiC/SiP, or SiCP, is epitaxially grown with an n-type dopant for straining an n-type FinFET. That is, the strained material is doped with the n-type dopant to be the source and drain regions 120 of the n-type FinFET. The n-type dopant includes arsenic and/or phosphorus, and the strained material may be epitaxially grown by LPCVD process with in-situ doping. It should be noted that the material within the source and drain regions 120 may be disposed as a single-layered structure or a multi-layered structure, with different layers having different degrees of doping.

Referring to FIG. 1 and FIG. 1A, a first interlayer dielectric material layer 400a is disposed over the source and drain regions 120 and the isolation structures 200 surrounding the spacers 300 and the enclosure A. In other words, the first interlayer dielectric material layer 400a is formed adjacent to the spacers 300, outside of the spacers 300 and outside the enclosure A. In some embodiments, a material of the first interlayer dielectric material layer 400a includes low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. It is understood that the first interlayer dielectric material layer 400a may include one or more dielectric materials or one or more dielectric layers. In some embodiments, the first interlayer dielectric material layer 400a is formed to a suitable thickness by flowable CVD (FCVD), CVD, HDPCVD, SACVD, spin-on, sputtering, or other suitable methods. For example, an interlayer dielectric precursor layer (not shown) may be initially formed to cover the isolation structures 200, the source and drain regions 120, the spacers 300, and the temporary gate (not shown) formed in between the spacers 300. Subsequently, a thickness of the interlayer dielectric precursor layer is reduced until top surfaces 300u of the spacers 300 are exposed, so as to form the first interlayer dielectric material layer 400a. The thickness of the interlayer dielectric precursor layer may be adjusted via a chemical mechanical polishing (CMP) process, an etching process, or other suitable processes. The first interlayer dielectric material layer 400a faces an outer sidewall 300o of the spacers 300, so that within the enclosure A delimited by the spacers 300 the isolation structures 200 or the fins 110 are exposed, as illustrated in FIG. 1 and FIG. 1A. In some embodiments, portions of the spacers 300 (and the temporary gate disposed in between) may also be removed when removing material from the interlayer dielectric precursor layer to form the first interlayer dielectric material layer 400a, so that top surfaces 300u of the spacers 300 are substantially flush with the top surface 400t of the first interlayer dielectric material layer 400a.

Figure 2:
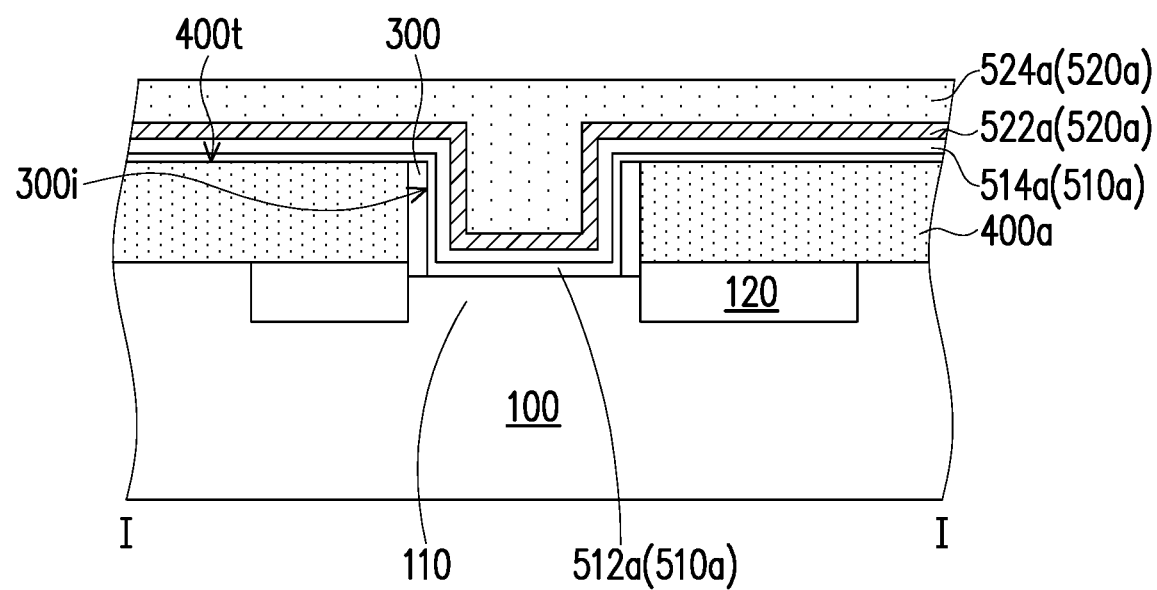
Figure 2A:
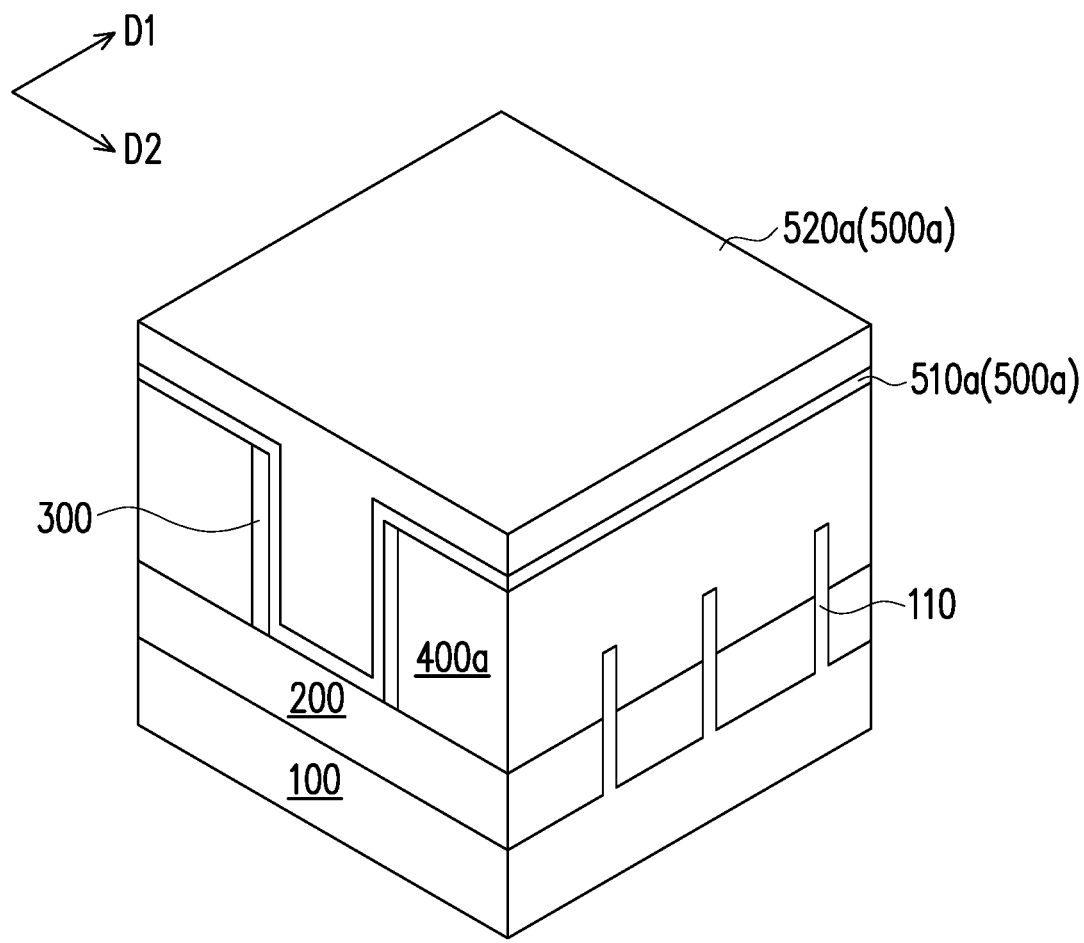
Figure 3:
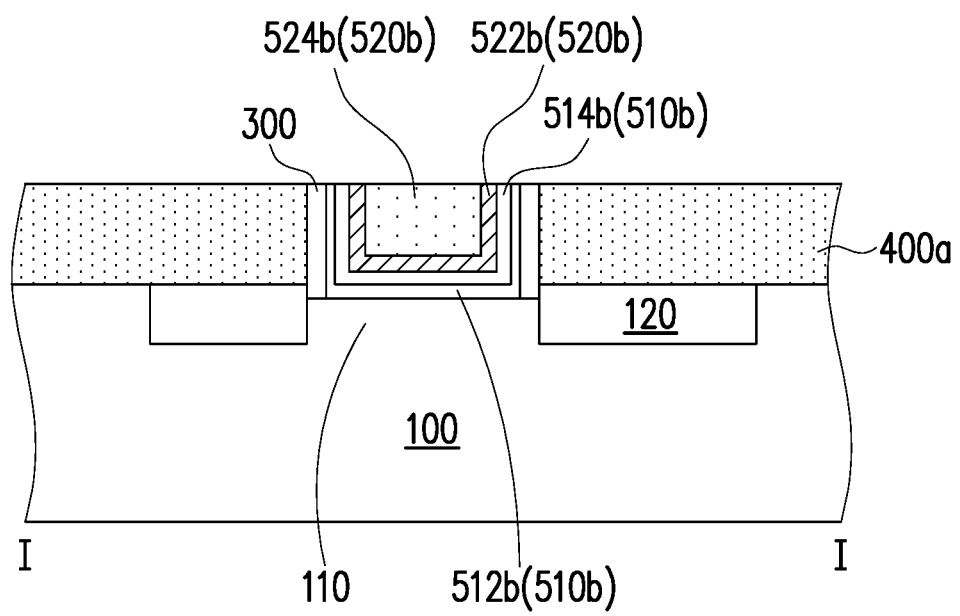
Figure 3A:
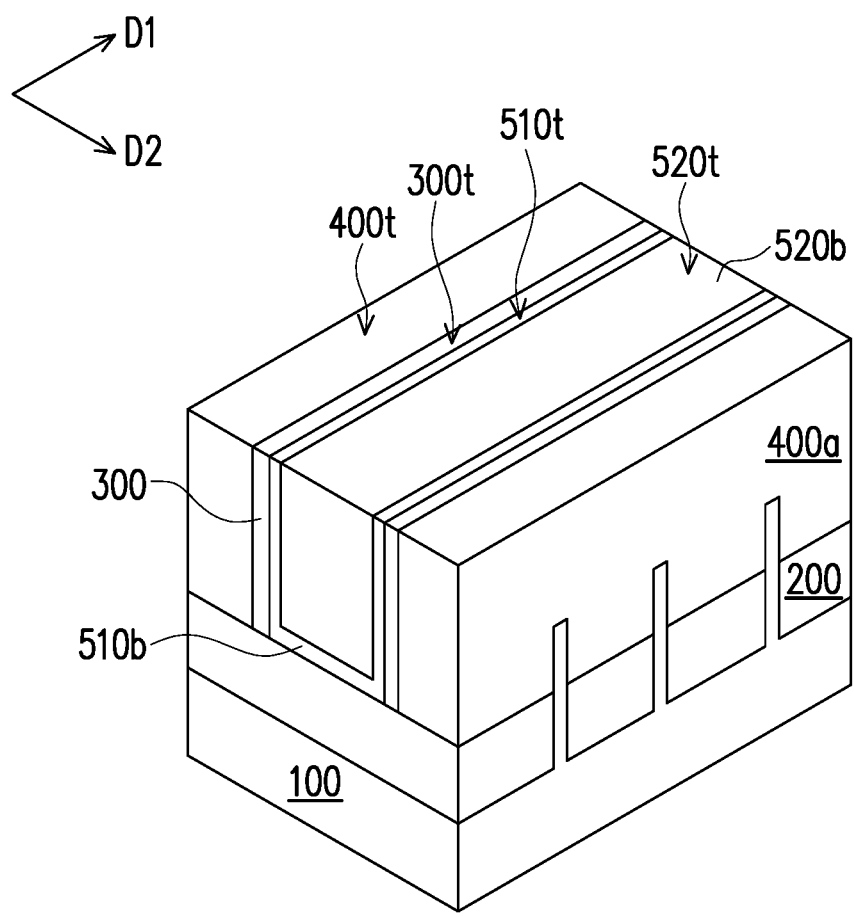
Figure 4:
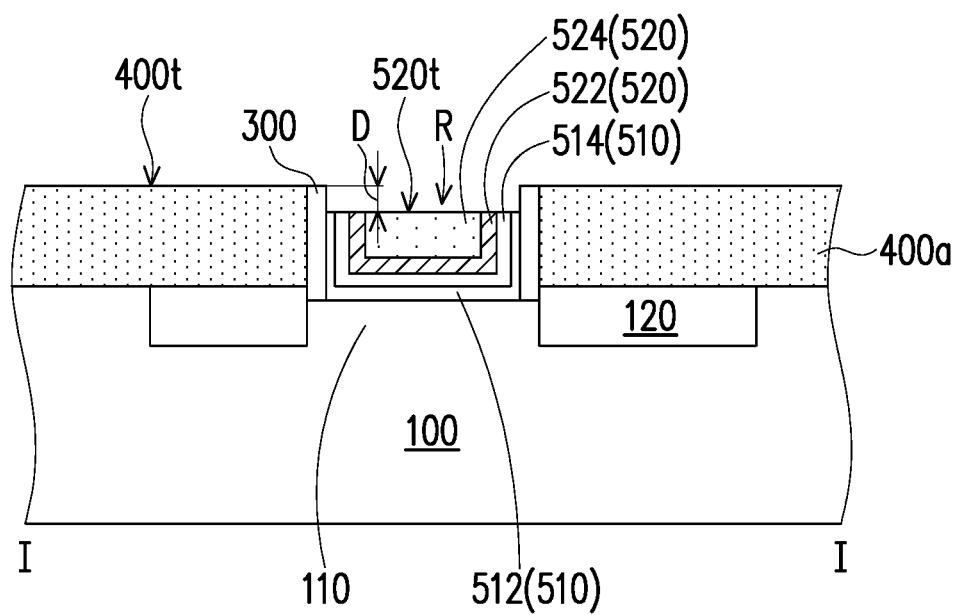
Figure 4A:
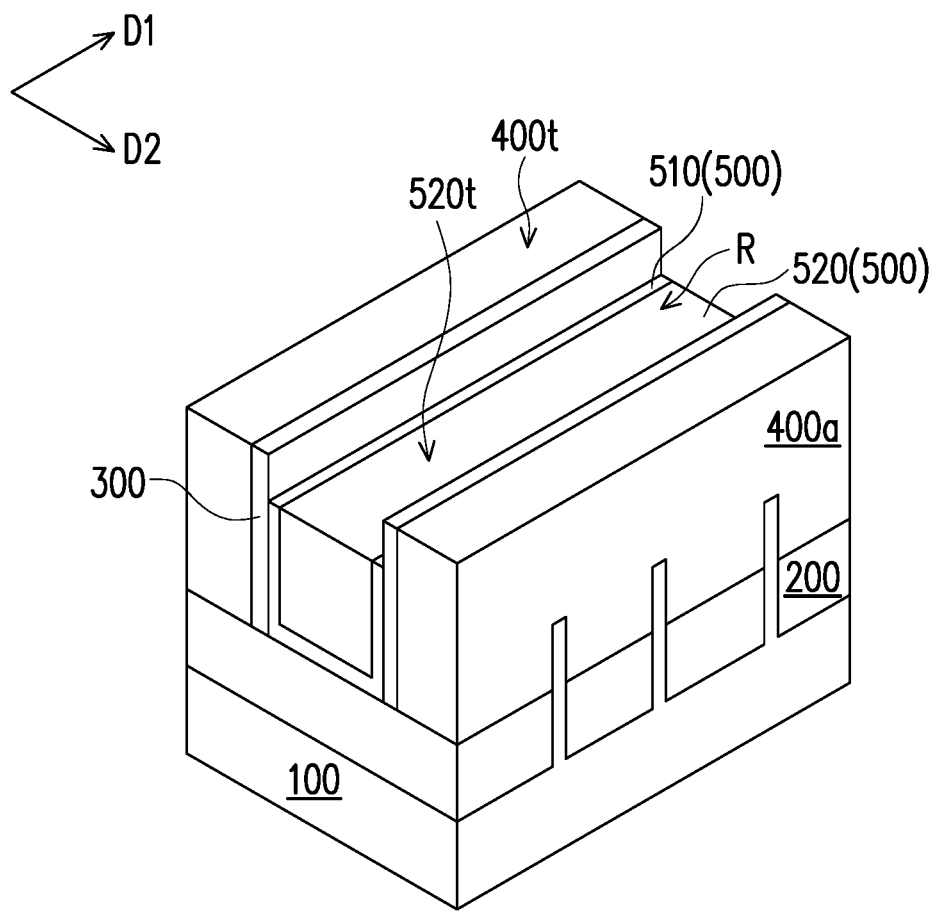

Referring to FIG. 2 and FIG. 2A, in some embodiments, a gate blanket structure 500a is formed over the exposed fins 110 and the isolation structures 200 disposed in between the fins 110 in the enclosure A (illustrated in FIG. 1A). In some embodiments, the gate blanket structure 500a extends within the enclosure A, and further extends over the spacers 300 and the first interlayer dielectric layer 400 outside of the enclosure A. In some embodiments, the gate blanket structure 500a contacts the fins 110 and the isolation structures 200 within the enclosure A, and further contacts the inner sidewalls 300i of the spacers 300 and the top surface 400t of the first interlayer dielectric material layer 400a. In some embodiments, the gate blanket structure 500a is conformally disposed over the fins 110 and the isolation structures 200 within the enclosure A. In some embodiments, a profile of the gate blanket structure 500a moving along the first direction D1 follows the profile of the fins 110. That is, the gate blanket structure 500a may include thicker portions extending over the isolation structures 200 in between the fins 110, and thinner portions over the fins 110. The thinner portions are formed when the gate blanket structure 500a passes over the fins 110, whilst the thicker portions correspond to the regions in between the fins 110 in which the gate blanket structure 500a extends over the isolation structures 200.

In some embodiments, the gate blanket structure 500a is formed by sequential deposition of multiple layers, as described in some detail below. In some embodiments, the gate blanket structure 500a includes blanket gate dielectric layers 510a and a blanket metal gate 520a. The blanket gate dielectric layers 510a may include an oxide interface material layer 512a and a high-k material layer 514a. The blanket metal gate 520a may include a work function material layer 522a, and a gate electrode material layer 524a. In some embodiments, the oxide interface material layer 512a, the high-k material layer 514a, the work function material layer 522a and the gate electrode material layer 524a are sequentially stacked on the fins 110, the isolation structures 200, and the first interlayer dielectric material layer 400a. In some alternative embodiments, the oxide interface material layer 512a may be omitted, and the high-k material layer 514a may be directly disposed on the fins 110 and the first interlayer dielectric material layer 400a. Even though in the perspective views of FIG. 2A to FIG. 7A the blanket gate dielectric layers 510a and the blanket metal gate 520a are shown as single layers, each may include multiple layers as described above, or additional layers according to the process and design requirements.

The oxide interface material layer 512a may include a dielectric material such as silicon oxide or silicon oxynitride (SiON). In some embodiments, the oxide interface material layer 512a may be formed by a deposition process such as atomic layer deposition (ALD), chemical vapor deposition (CVD), and/or other suitable deposition methods. In some alternative embodiments, the oxide interface material layer 512a may be formed on an exposed portion of the fin 110 through an oxidation process. For example, the fin 110 may be oxidized with a wet process or via thermal oxidation. When the oxide interface material layer 512a is formed by an oxidation process, the oxide interface material layer 512a may exhibit a different profile than the one illustrated in FIG. 2. In some embodiments, the oxide interface material layer 512a may provide increased adhesion between the semiconductor surface (i.e., the fins 110) and the high-k material layer 514a.

In some embodiments, the high-k material layer 514a is formed over the oxide interface material layer 512a. In some embodiments, as shown in FIG. 2, the oxide interface material layer 512a may further extend between the high-k material layer 514a and the spacers 300. In some alternative embodiments, the high-k material layer 514a physically contacts the inner sidewall 300i of the spacer 310. In some embodiments, the high-k material layer 514a has a dielectric constant greater than about 4, greater than about 12, greater than about 16, or even greater than about 20. For example, a material of the high-k material layer 514a may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or other suitable materials. In some alternative embodiments, the material of the high-k material layer 514a may optionally include a silicate such as HfSiO, HfSiON LaSiO, AlSiO, or a combination thereof. In some embodiments, the method of forming the high-k material layer 514a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, the work function material layer 522a is formed over the blanket gate dielectric layers 510a. A material of the work function material layer 522a may be selected according to the conductivity type desired for the transistor. For example, p-type work function materials that may be included in the work function material layer 522a include TiN, TaN, Ru, Mo, Al, WN, $ZrSi_2$, $MoSi_2$, $TaSi_2$, $NiSi_2$, WN, other suitable p-type work function materials, or combinations thereof. On the other hand, n-type work function materials that may be included in the work function material layer 522a include Ti, Ag, TaAl, TaAlC, TiAlN, TaC, TaCN, TaSiN, Mn, Zr, other suitable n-type work function materials, or combinations thereof. In some embodiments, the method of forming the work function material layer 522a includes performing at least one suitable deposition technique, such as CVD, PECVD, ALD, RPALD, PEALD, MBD, or the like. In some embodiments, the work function material layer 520a serves the purpose of adjusting a threshold voltage of the transistor.

In some embodiments, the gate electrode material layer 524a is formed over the work function material layer 522a. In some embodiments, a material of the gate electrode material layer 524a includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some alternative embodiments, the gate blanket structure 500a may further include barrier layers, work function layers, liner layers, interface layers, seed layers, adhesion layers, etc.

Referring to FIG. 2, FIG. 2A, FIG. 3 and FIG. 3A, a planarization process may be performed in which portions of the gate blanket structure 500a are removed until the top surfaces 300t of the spacers 300 and the top surface 400t of the first interlayer dielectric material layer 400a are exposed. To this end, a chemical mechanical polishing (CMP) process or an etching process may be performed. In some embodiments, the portions of the blanket gate dielectric layers 510a extending over the first interlayer dielectric material layer 400a are removed, thus forming the gate dielectric precursor layers 510b (e.g., the oxide interface precursor layer 512b and the high-k precursor layer 514b). Portions of the blanket metal gate 520a are also removed to form precursor metal gate 520b (e.g., the work function precursor layer 522b and the gate electrode precursor layer 524b). Following the planarization process, top surfaces 300t of the spacers 300 may be substantially flush with the top surface 400t of the first interlayer dielectric material layer 400a, with the top surface 510t of the portions of the gate dielectric precursor layers 510b extending on the spacers 300, and with the top surface 520t of the precursor metal gate 520b. Referring to FIG. 3, FIG. 3A, FIG. 4 and FIG. 4A, portions of the precursor metal gate 520b may be removed to form the metal gate 520, including the work function layer 522 and the gate electrode layer 524. For example, an etching process may be performed to recess the precursor metal gate 520b with respect to the height level of the top surfaces 300t and 400t. In some embodiments, the gate dielectric precursor layers 510b are also recessed, for example via an etching process, to a substantially same level height as the metal gate 520, thus forming the high-k layer 514 and the oxide interface layer 512. That is, the gate structure 500 may include the gate dielectric layers 510 (e.g., the oxide interface layer 512 and the high-k layer 514), and the metal gate 520. The gate dielectric layers 510 extend on the inner sidewalls of the spacers 300, the fins 110, and the isolation structures 200 in between the fins 110, and the metal gate 520 extends on the gate dielectric layers 510 without reaching the same level height as the spacers 300 or the first interlayer dielectric material layer 400a. In some embodiments, the depth D of the recess R may be considered as the difference in height levels between the top surface 520t of the metal gate 520 and the top surface 400t of the first interlayer dielectric material layer 400a. In some embodiments, the depth D of the recess R may be in the range from 5 nm to 200 nm. For example, the depth D of the recess may be about 150 Angstrom.

Figure 5:
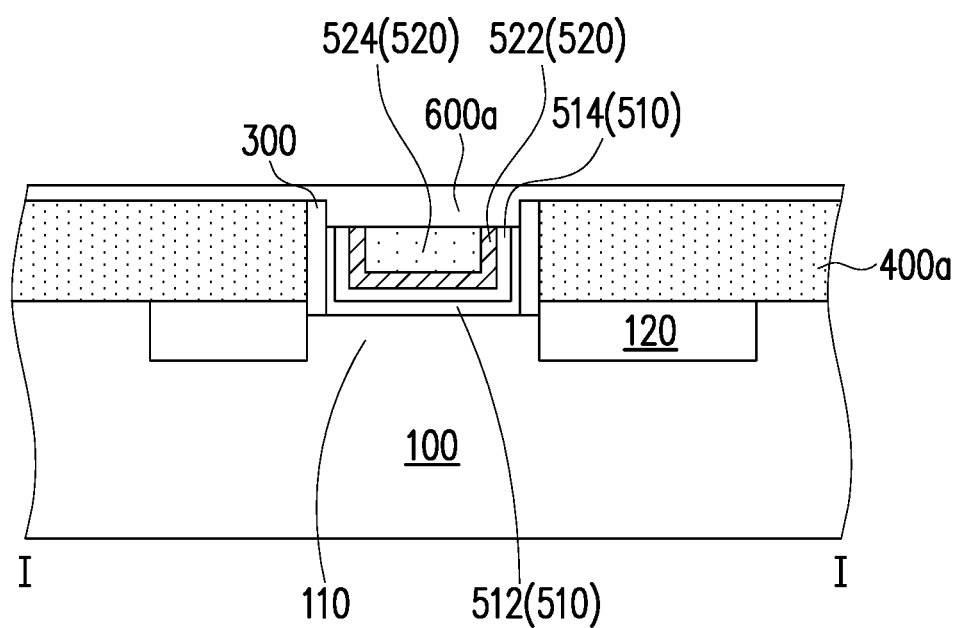
Figure 5A:
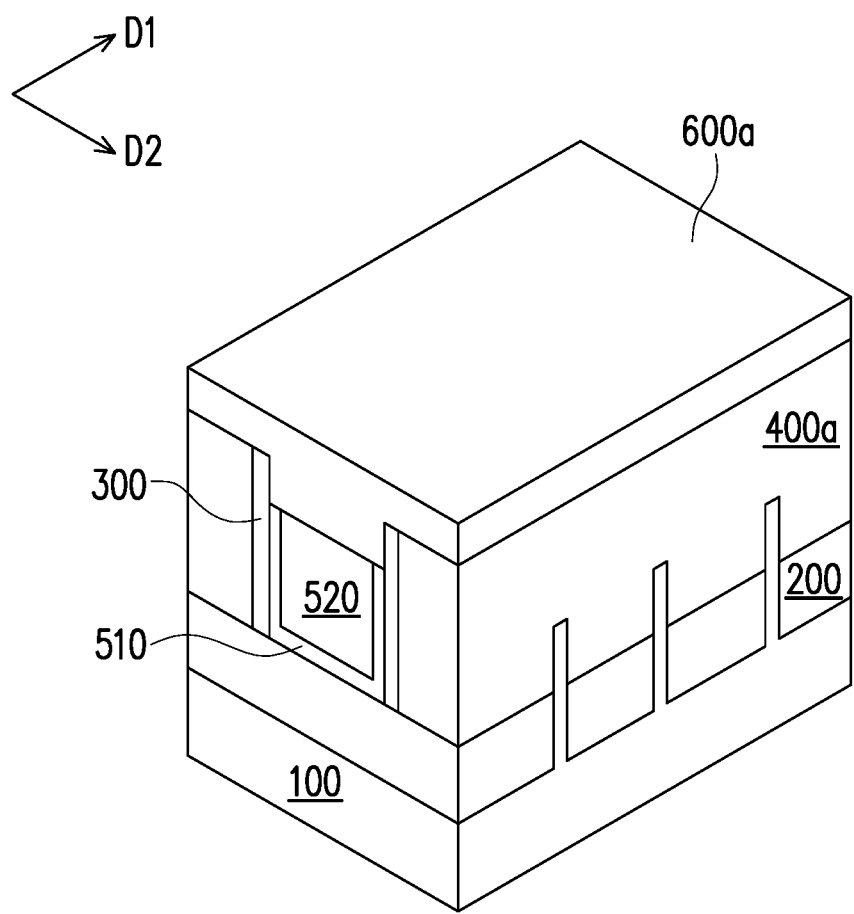
Figure 6:
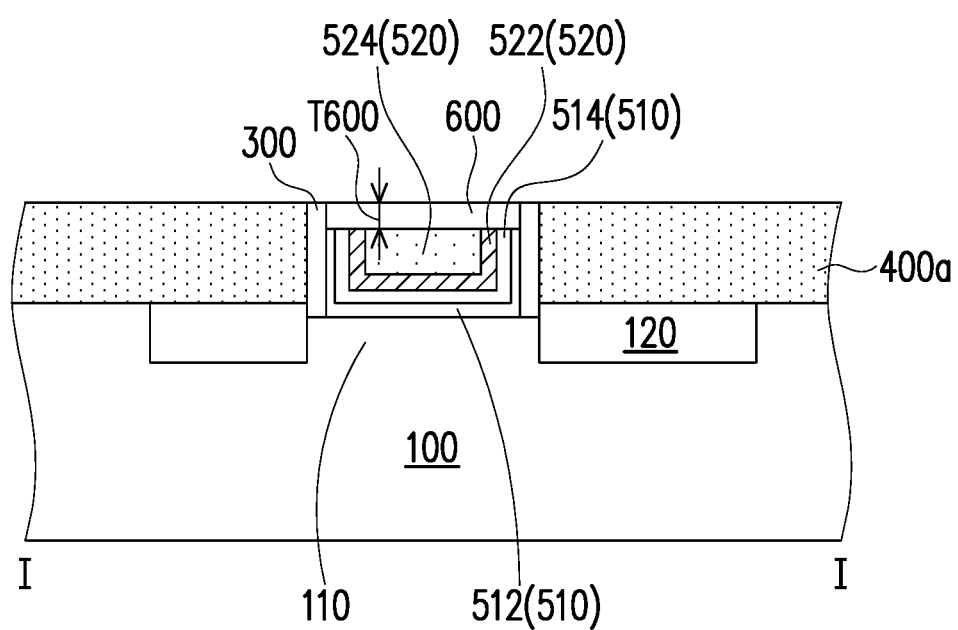
Figure 6A:
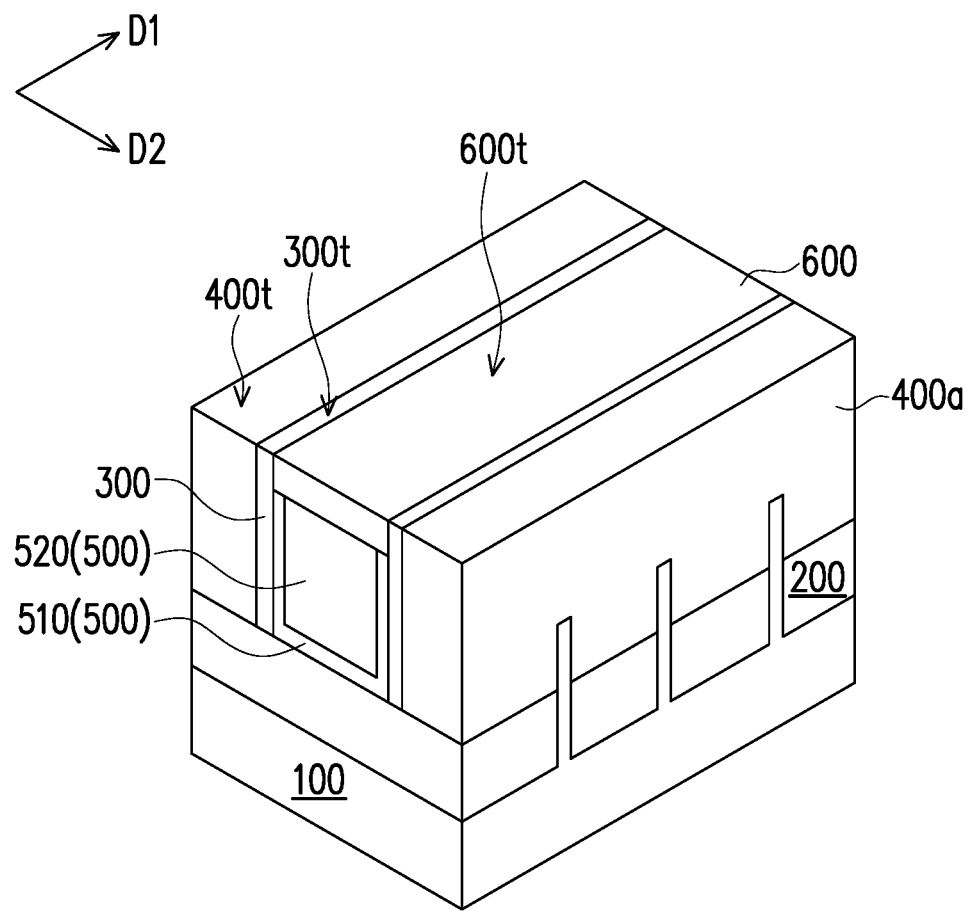
Figure 7:
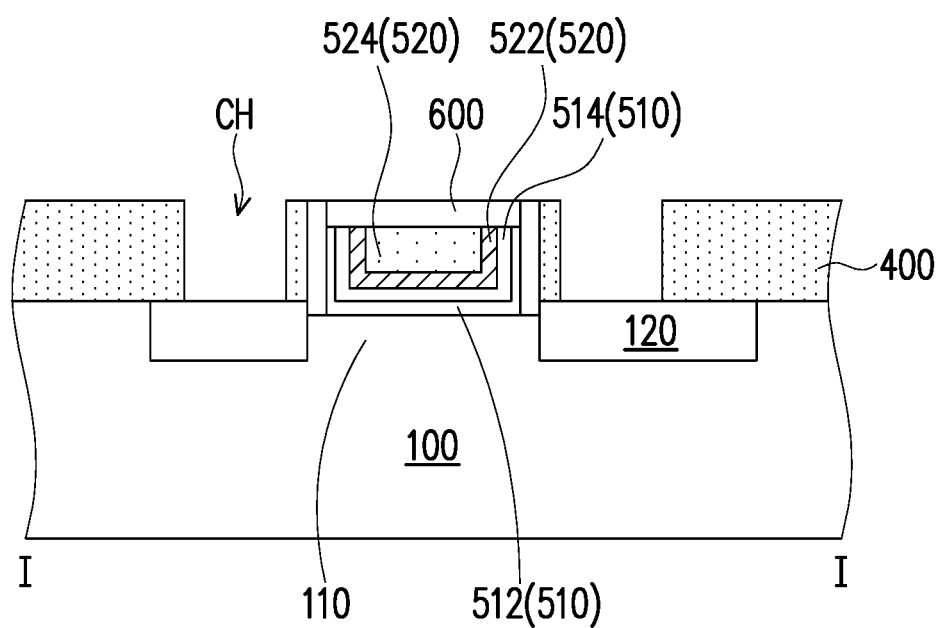
Figure 7A:
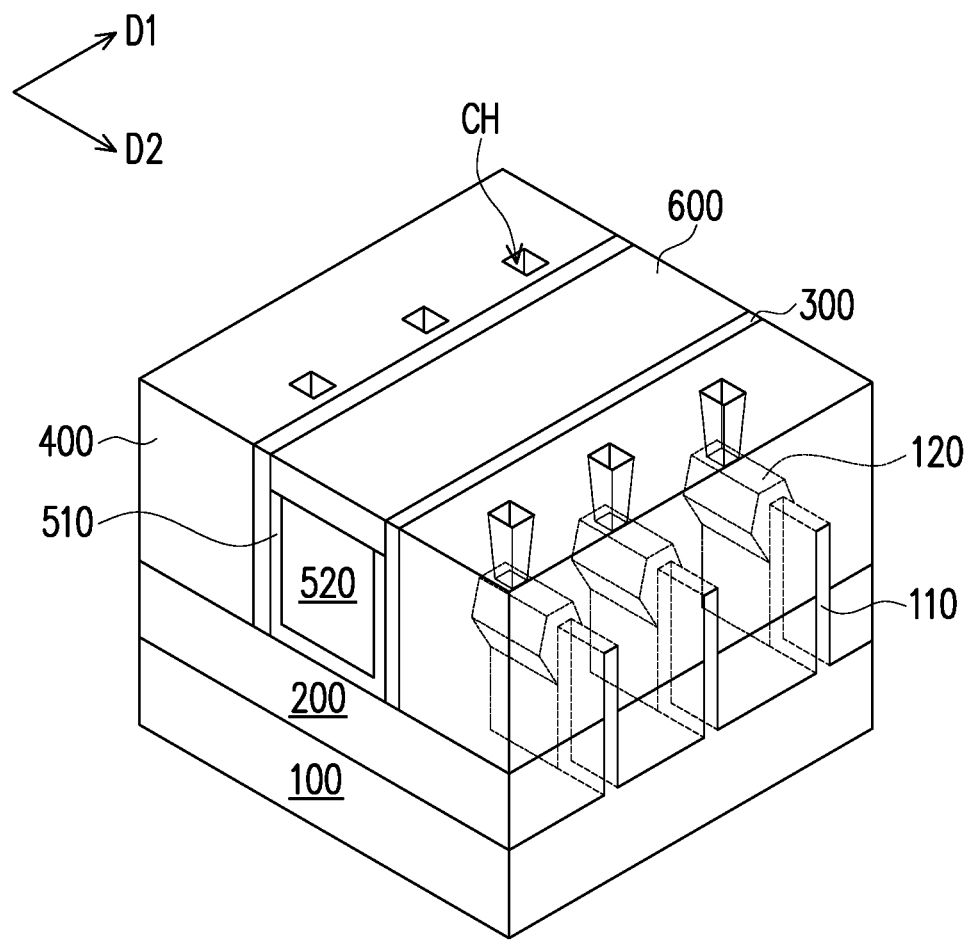

In some embodiments, referring to FIG. 4, FIG. 4A, FIG. 5 and FIG. 5A, a capping material layer 600a is formed covering the gate structure 500, the spacers 300, and the first interlayer dielectric material layer 400a. As shown in FIG. 5A, the capping material layer 600a may completely fill the recess R and may further extend over the first interlayer dielectric material layer 400a and the spacers 300. In some embodiments, a material of the capping material layer 600a includes a low-k dielectric material. In some embodiments, the material of the capping material layer 600a is different from the material of the first interlayer dielectric layer 400. In some embodiments, the capping material layer 600a includes $Si_3N_4$, SiC, or SiOC. In some embodiments, the capping material layer 600a is made of $Si_3N_4$, SiC, or SiOC. In some embodiments, the material of the capping material layer 600a consists of $Si_3N_4$, SiC, or SiOC. In some embodiments, selective etching is possible between the capping material layer 600a and the first interlayer dielectric material layer 400a. In some embodiments, the capping material layer 600a is formed with methods similar to the ones previously discussed for the first interlayer dielectric layer 400 with reference to FIG. 1 and FIG. 1A, and a detailed description is omitted for the sake of brevity.

Referring to FIG. 5, FIG. 5A, FIG. 6 and FIG. 6A, a planarization process is performed during which portions of the capping material layer 600a are removed until the top surfaces 300t of the spacers 300 and top surfaces 400t of the first interlayer dielectric material layer 400a are exposed. To this end, a chemical mechanical polishing (CMP) process or an etching process may be performed. Following the planarization process, the capping layer 600 fills the recess R on top of the metal gate 520 and the gate dielectric layers 510, and contacts along its side surfaces the spacers 300. In some embodiments, the thickness T600 of the capping layer 600 may be in the range from 10 nanometers to 9 micrometers. For example, the capping layer 600 may be thick about 15 nanometers. Gate contacts (not shown) may be later formed through the capping hole 600 to establish electrical contact with the metal gate 520.

Referring to FIG. 6, FIG. 6A, FIG. 7 and FIG. 7A, one or more contact holes CH are opened in the first interlayer dielectric material layer 400a on both sides of the spacers 300. That is, the first interlayer dielectric material layer 400a may be patterned to form a first interlayer dielectric layer 400 including the contact holes CH. The contact holes CH may open in the first interlayer dielectric layer 400 in correspondence of the source and drain regions 120. That is, the contact holes CH may vertically extend throughout the first interlayer dielectric layer 400 to expose, at their bottom, a source and drain region 120. In some embodiments, each contact hole CH opens on a different source and drain region 120. In some embodiments, the contact holes CH may have the shape of inverted frustra (truncated cones or pyramids), being larger towards the top and narrowing down towards the source and drain regions 120.

Figure 8:
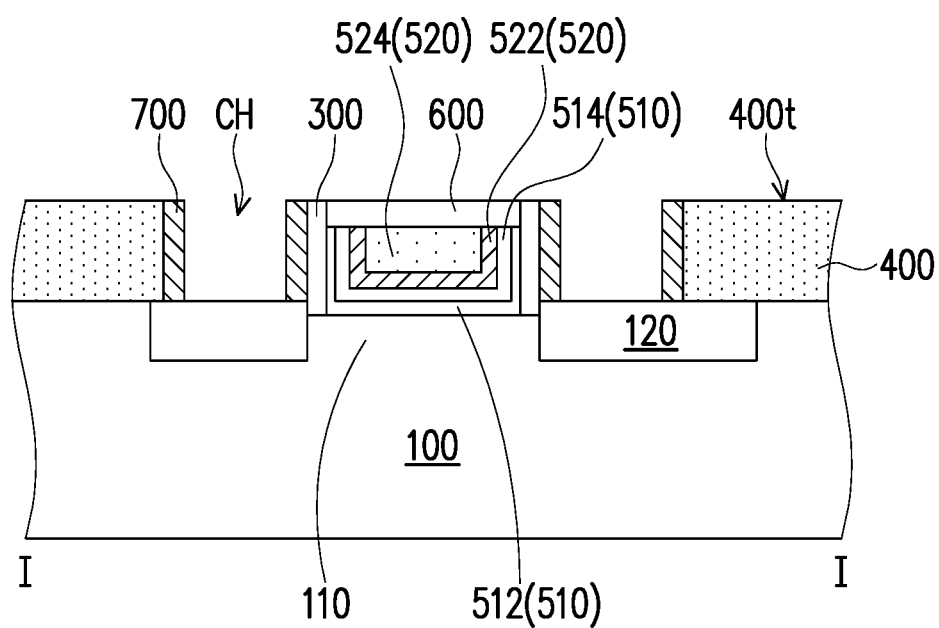
Figure 9:
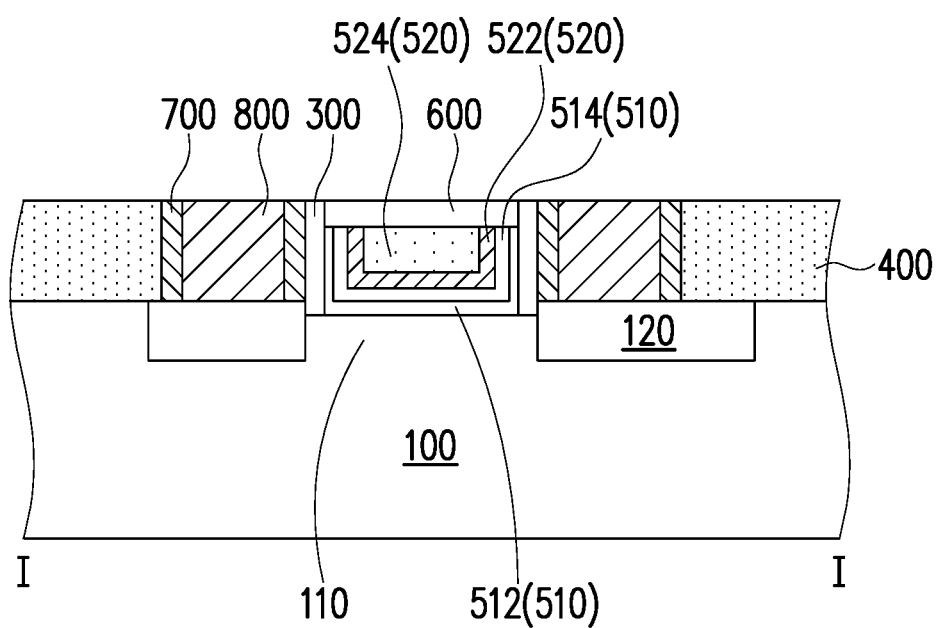

Referring to FIG. 8, in some embodiments, lining layers 700 are formed within the sidewalls of the contact holes CH, on the first interlayer dielectric layer 400. In some embodiments, a blanket dielectric layer (not shown) is formed, for example, via atomic layer deposition (ALD). Thereafter, portions of the blanket dielectric layer extending on the source and drain regions 120 and on top of the first interlayer dielectric layer 400 and the capping layer 600 are removed, for example via an etching step. Following the etching step, the lining layers 700 may remain on the portions of first interlayer dielectric layer 400 constituting the sidewalls of the contact holes CH. In some embodiments, the first interlayer dielectric layer 400 may include, be made of, or consist of silicon oxide, and the lining layers 700 may include, be made of, or consist of silicon nitride Referring to FIG. 9, lower source and drain contacts 800 may be formed by providing a conductive material in the contact holes CH. In some embodiments, the conductive material is disposed on the portions of the source and drain regions 120 exposed by the contact holes CH. In some embodiments, the conductive material of the lower source and drain contacts 800 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material of the lower source and drain contacts 800 may be cobalt, tungsten or copper. In some embodiments, the conductive material of the lower source and drain contacts 800 includes cobalt. In some embodiments, the conductive material may be formed by using sputtering, chemical vapor deposition (CVD), physical vapor deposition (PVD), atomic layer deposition (ALD), other deposition techniques, or a combination thereof. In some embodiments, the conductive material may be provided on one or more seed layers, barrier layers, etc (not shown). That is, the lower source and drain contacts 800 may include one or more seed layers, barrier layers, etc. In some embodiments, a planarization process may further be performed, so that top surfaces of the spacers 300, the first interlayer dielectric layer 400, the gate dielectric layers 510, the capping layer 600, the lining layers 700 and the lower source and drain contacts 800 are substantially flush with respect to each other (are substantially at the same level height).

Figure 10:
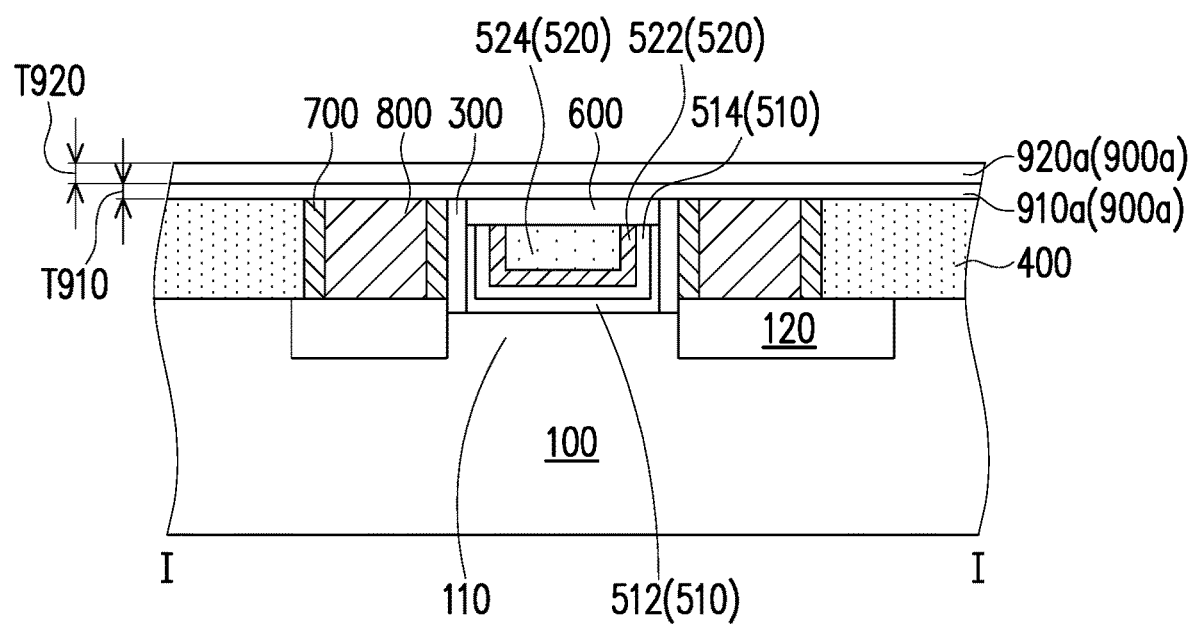

Referring to FIG. 10, in some embodiments an etch stop material layer 900a is formed on the spacers 300, the first interlayer dielectric layer 400, the gate dielectric layers 510, the capping layer 600, the lining layers 700 and the lower source and drain contacts 800. In some embodiments, the etch stop material layer 900a is a bi-layer etch stop material layer, including a lower blanket etch stop layer 910a and an upper blanket etch stop layer 920a. In some embodiments, the lower blanket etch stop layer 910a is formed before the upper blanket etch stop layer 920a, and, as such, is disposed between the upper blanket etch stop layer 920a and the first interlayer dielectric layer 400, the capping layer 600, the lower source and drain contacts 800, and so on. In some embodiments, the lower blanket etch stop layer 910a is formed directly on (in direct contact with) the first interlayer dielectric layer 400, the capping layer 600, and the lower source and drain contacts 800. The lower blanket etch stop layer 910a may further contact the lining layers 700 and the gate dielectric layers 510. In some embodiments, the upper blanket etch stop layer 920a is formed directly on (in direct contact with) the lower blanket etch stop layer 910a. In some embodiments, the thicknesses T910, T920 of the lower blanket etch stop layer 910a and the upper blanket etch stop layer 920a are each independently in the range from 20 Angstrom to 50 Angstrom.

The lower blanket etch stop layer 910a and the upper blanket etch stop layer 920a includes different materials. The material of the lower blanket etch stop layer 910a has a different etching behavior than the material of the upper blanket etch stop layer 920a. That is, the material of the upper blanket etch stop layer 920a may be selectively removed with respect to a material of the lower blanket etch stop layer 910a. The material of the lower blanket etch stop layer 910a also differs from the material of the capping layer 600. That is, the material of the lower blanket etch stop layer 910a has also a different etching behavior than the material of the capping layer 600, and may be selectively removed with respect to the material of the capping layer 600. In some embodiments, the material of the capping layer 600 and the material of the upper blanket etch stop layer 920a are selected from a first group of materials, and the material of the lower blanket etch stop layer 910a is selected from a second group of materials, where the first group of materials and the second group of materials include different compounds or materials having different etching behavior. For example, the first group of materials may include $Si_3N_4$, and the second group of materials may include AlN, $Al_2O_3$, SiC and SiOC. In such cases, the capping layer 600 and the upper blanket etch stop layer 920a may include, be made of, or consist of $Si_3N_4$, and the lower blanket etch stop layer may include, be made of, or consist of AlN, $Al_2O_3$, SiC, or SiOC. In some alternative embodiments, the first group of materials may include SiC and SiOC, and the second group of materials may include AlN, $Al_2O_3$, and $Si_3N_4$. In such cases, the capping layer 600 and the upper blanket etch stop layer 920a may include, be made of, or consist of SiC or SiOC, and the lower blanket etch stop layer may include, be made of, or consist of AlN, $Al_2O_3$, or $Si_3N_4$. In some embodiments, the capping layer 600 and the upper blanket etch stop layer 920a include, are made of, or consist of the same material. For example, the capping layer 600 and the upper blanket etch stop layer 920a may both include, be made of, or consist of $Si_3N_4$, SiC, or SiOC. In some alternative embodiments, the capping layer 600 and the upper blanket etch stop layer 920a include different materials. In some embodiments, the lower blanket etch stop layer 910a does not include the same material included in the capping layer 600 and/or the upper blanket etch stop layer 920a. For example, if the upper blanket etch stop layer 920a and the capping layer 600 include $Si_3N_4$, the lower blanket etch stop layer 910a does not include $Si_3N_4$, and so on. In some embodiments, the materials of the capping layer 600, the lower blanket etch stop layer 910a and the upper blanket etch stop layer 920a may be formed by suitable deposition processes, for example via ALD or PECVD. In some embodiments, the deposition technique may be selected in function of the material used. For example, $Si_3N_4$, SiC, and SiOC, may be deposited by PECVD, while MN and $Al_2O_3$ may be deposited by ALD.

Figure 11:
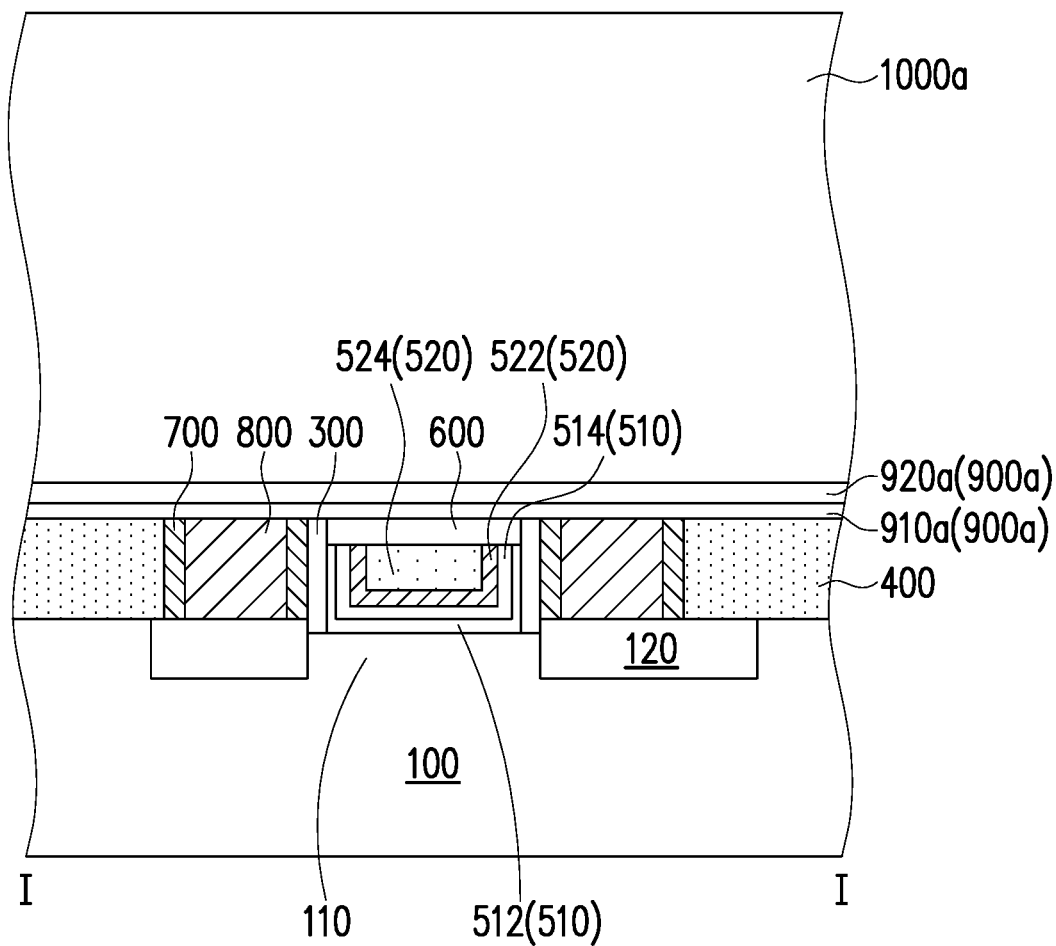

Referring to FIG. 11, a second interlayer dielectric material layer 1000a may be provided on the etch stop material layer 900a. The second interlayer dielectric material layer 1000a may extend on the etch stop material layer 900a, over the spacers 300, the first interlayer dielectric layer 400, the gate dielectric layers 510, the metal gate 520, the capping layer 600, the lining layers 700, and the lower source and drain contacts 800. In some embodiments, a material of the second interlayer dielectric material layer 1000a may include a low-k dielectric material, and may be formed similarly to what previously described with reference to the first interlayer dielectric material layer 400a. In some embodiments, the second interlayer dielectric material layer 1000a includes silicon oxide. In some embodiments, the second interlayer dielectric material layer 1000a includes the same material as the first interlayer dielectric layer 400. In some alternative embodiments, the second interlayer dielectric material layer 1000a and the first interlayer dielectric layer 400 include different materials.

Figure 12:
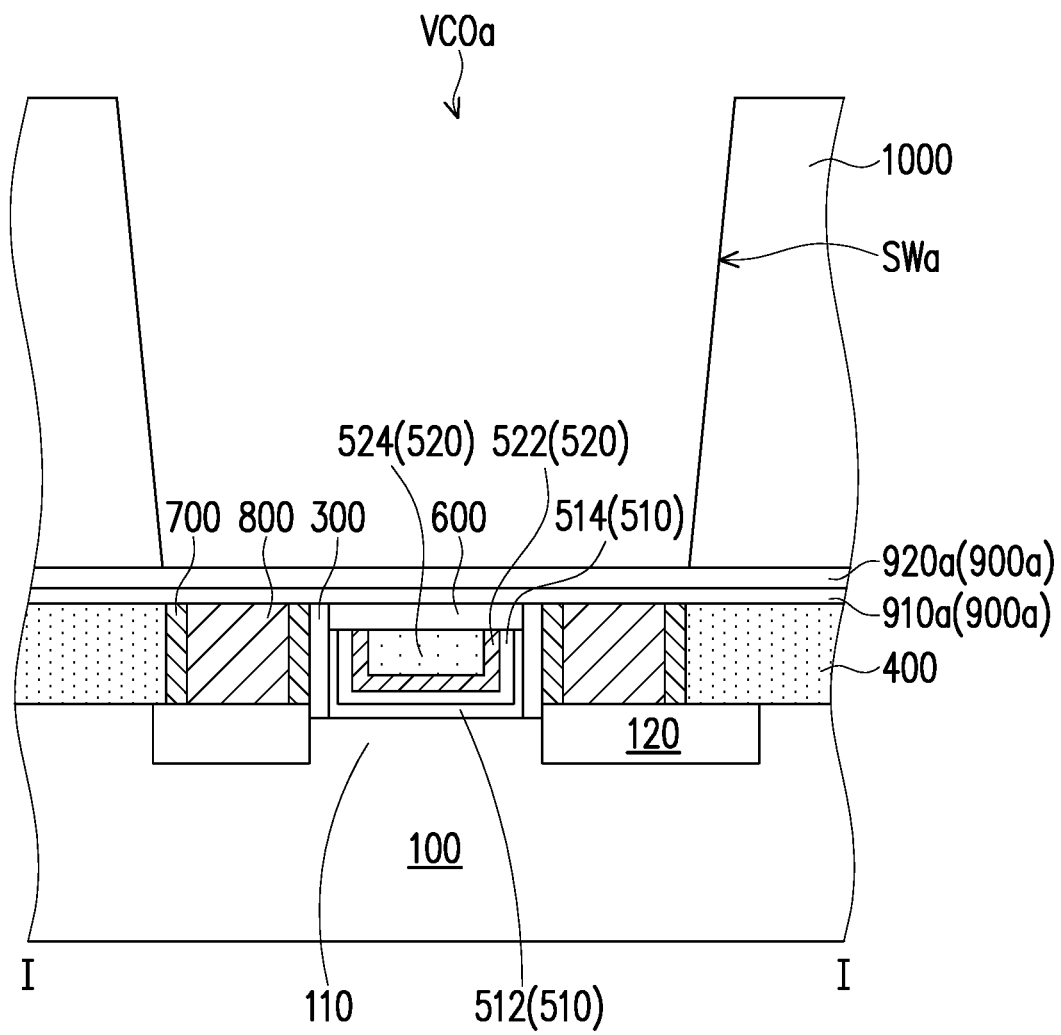

Referring to FIG. 11 and FIG. 12, the second interlayer dielectric material layer 1000a is patterned to form the second interlayer dielectric layer 1000 including precursor via contact openings VCOa. In some embodiments, the precursor via contact openings VCOa vertically extend through the second interlayer dielectric layer 1000 to expose portions of the etch stop material layer 900a. For example, the upper blanket etch stop layer 920a may be exposed at the bottom of the precursor via contact openings VCOa. In some embodiments, the sidewalls SWa of the precursor via contact openings VCOa may be tapered. That is, the precursor via contact openings VCOa may become narrower moving towards the etch stop material layer 900a. In some embodiments, the precursor via contact openings VCOa may be formed by removing portions of the second interlayer dielectric material layer 1000a, for example during an etching step. In some embodiments, the material of the second interlayer dielectric material layer 1000a may be selectively etched with respect to the material of the upper blanket etch stop layer 920a. That is, the material of the second interlayer dielectric material layer 1000a may have a different etching behavior with respect to the material of the upper blanket etch stop layer 920a. In the present disclosure, when a first material has a different etching behavior than a second material it is possible to find conditions to selectively remove the first material without significantly removing the second material. For example, the thickness T920 (illustrated in FIG. 10) of the upper blanket etch stop layer 920a after the etching step in which the precursor via contact openings VCOa are opened may be within 90 to 100% of the thickness T920 before the same etching step. For example, following etching of the second interlayer dielectric material layer 1000a, the upper blanket etch stop layer 920a may lose up to 10% of its original thickness T920. That is, the upper blanket etch stop layer 920a may be substantially undamaged following the etching of the second interlayer dielectric material layer 1000a. The upper blanket etch stop layer 920a may protect the underlying layers (e.g., the lower blanket etch stop layer 910a, the capping layer 600, and so on), during the etching of the second interlayer dielectric material layer 1000a.

Figure 13:
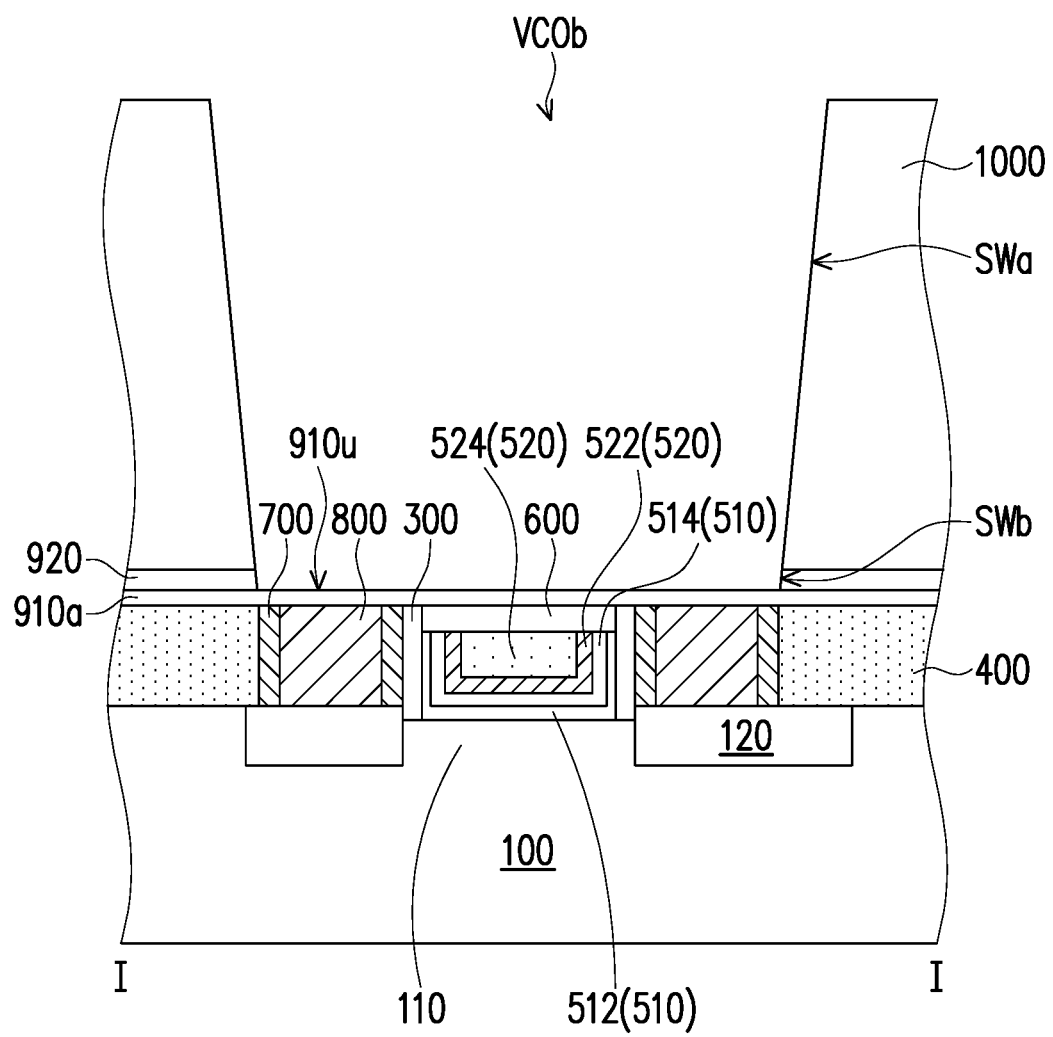

In some embodiments, referring to FIG. 12 and FIG. 13, the precursor via contact openings VCOa may be extended towards the lower source and drain contacts 800 and the capping layer 600 by removing the exposed portion of upper blanket etch stop layer 920a. The resulting extended via contact openings VCOb expose at their bottom a portion of the lower blanket etch stop layer 910a extending over the lower source and drain contacts 800 and the capping layer 600. After the precursor via contact openings VCOa are extended, the upper etch stop layer 920 remains between the lower blanket etch stop layer 910a and the second interlayer dielectric layer 1000 in correspondence of the regions of the lower blanket etch stop layer 910a extending on the first interlayer dielectric layer 400. That is, the portion of the upper blanket etch stop layer 920a extending over the capping layer 600 and the lower source and drain contacts 800 may be removed, while the portions of upper blanket etch stop layer 920a which are covered by the second interlayer dielectric layer 1000 may be retained even after the extended via contact openings VCOb are formed. As such, the extended via contact openings VCOb open through the second interlayer dielectric layer 1000 and the upper etch stop layer 920, and reach the lower blanket etch stop layer 910a. The sidewalls of the extended via contact openings VCOb include the first section SWa formed by the second interlayer dielectric layer 1000, and a second section SWb formed by the upper etch stop layer 920. In some embodiments, the first section SWa and the second section SWb may have the same inclination (may be inclined at a same tapering angle) with respect to the upper surface 910u of the lower blanket etch stop layer 910a (the surface of the lower blanket etch stop layer 910a exposed by the extended via contact openings VCOb). That is, the profile of the sidewalls of the extended via contact openings VCOb may be substantially continuous (straight, albeit not necessarily vertical or normal to the lower blanket etch stop layer 910a). In some alternative embodiments, the tapering angle of the first section SWa differs from the tapering angle of the second section SWb2, and the overall profile of the sidewalls of the extended via contact openings VCOb is bent at the interface between the second interlayer dielectric layer 1000 and the upper etch stop layer 920. In some embodiments, the material selected for the lower blanket etch stop layer 910a has a different etching behavior than the material selected for the capping layer 600 and the material selected for the upper blanket etch stop layer 920a. For example, if the upper blanket etch stop layer 920a is subjected to first etching conditions, after the etching of the upper blanket etch stop layer 920a has not lost more than 10% with respect to the thickness T910 before the etching of the upper blanket etch stop layer 920a. That is, the thickness T910 of the lower blanket etch stop layer 910a after the etching of the upper blanket etch stop layer 920a may be 90% of the thickness T910 before the same etching step. Alternatively stated, the lower blanket etch stop layer 910a may be substantially undamaged following the etching of the upper blanket etch stop layer 920a.

Figure 14:
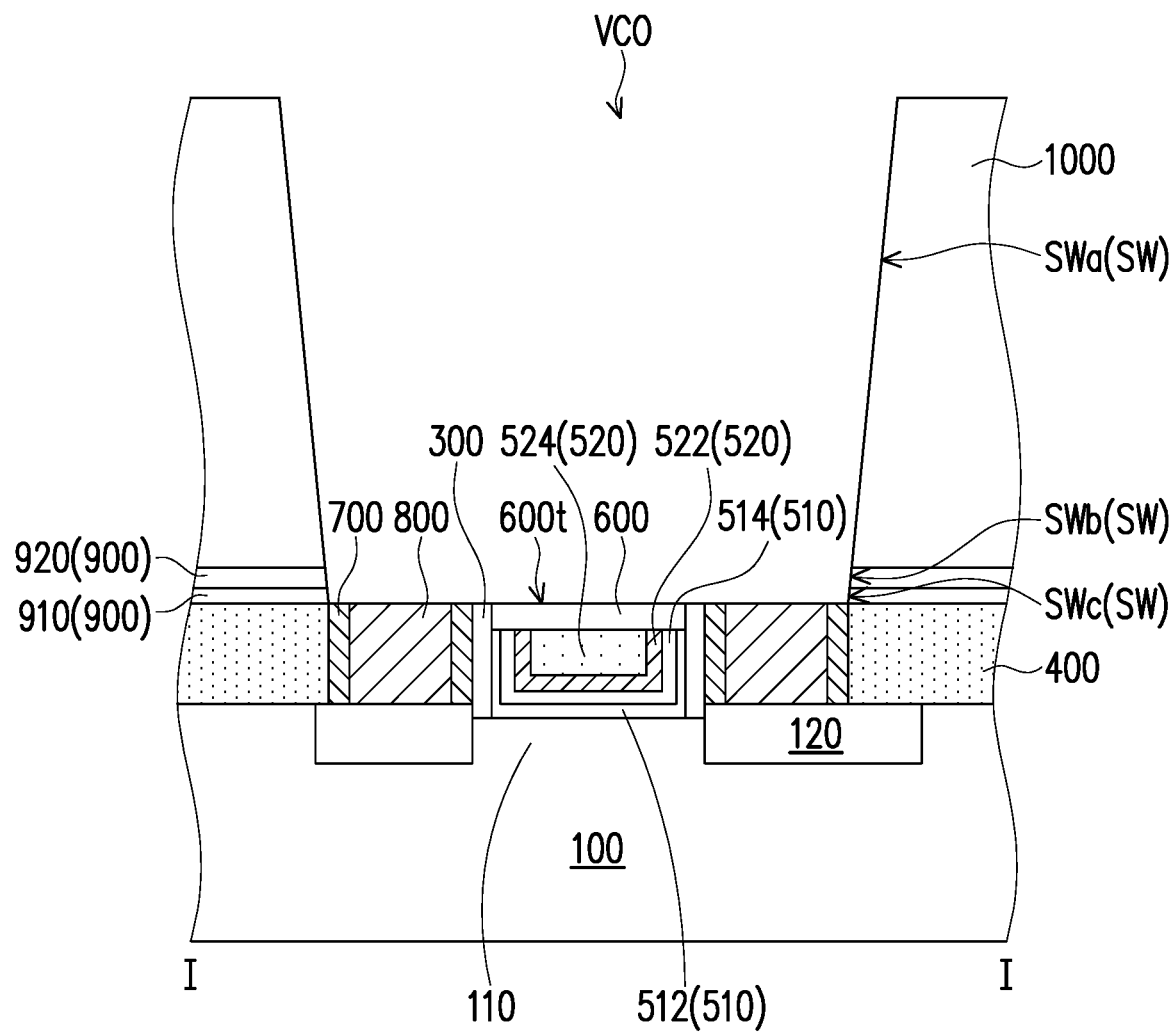

Referring to FIG. 13 and FIG. 14, the extended via contact openings VCOb may be further extended through the lower blanket etch stop layer 910a to form the via contact openings VCO. The resulting via contact openings VCO expose at their bottom the capping layer 600 and the lower source and drain contacts 800. The gate dielectric layers 510, the spacers 300 and some of the lining layers 700 may also be exposed by the via contact openings VCO. After the extended via contact openings VCOb are further extended, the lower etch stop layer 910 remains between the first interlayer dielectric layer 400 and the upper etch stop layer 920. That is, the portion of the lower blanket etch stop layer 910a extending on the capping layer 600 and the lower source and drain contacts 800 may be removed, while the portions of lower blanket etch stop layer 910a which are covered by the second interlayer dielectric layer 1000 and the upper etch stop layer 920 may be retained even after the via contact openings VCO are formed. As such, the extended via contact openings VCO open through the second interlayer dielectric layer 1000, the upper etch stop layer 920, and the lower etch stop layer 910. The sidewalls SW of the via contact openings VCO include the first section SWa formed by the second interlayer dielectric layer 1000, the second section SWb formed by the upper etch stop layer 920, and the third section SWc formed by the lower etch stop layer 910. In some embodiments, the sections SWa, SWb, and SWc may have the same inclination (may be inclined at a same tapering angle) with respect to the top surface 600t of the capping layer 600. That is, the profile of the sidewalls SW may be substantially continuous (straight, albeit not necessarily vertical or normal to the top surface 600t). In some alternative embodiments, the tapering angle of the sections SWa-c may independently vary, and the overall profile of the sidewalls SW may be bent at the interfaces between the second interlayer dielectric layer 1000 and the upper etch stop layer 920, or between the upper etch stop layer 920 and the lower etch stop layer 910. In some embodiments, the material selected for the lower blanket etch stop layer 910a has a different etching behavior than the material selected for the capping layer 600. As such, the capping layer 600 does not lose more than 10% of its thickness following the etching of the lower blanket etch stop layer 910a. That is, thickness T600 of the capping layer 600 after the etching of the lower blanket etch stop layer 910a is within 90% of the thickness T600 before the same etching step. Alternatively stated, the capping layer 600 may be substantially undamaged following the etching of the lower blanket etch stop layer 910a. In some embodiments, the material of the lower blanket etch stop layer 910a is suitable to be removed in etching conditions in which the material of the capping layer 600 is not removed.

As described above with reference to FIG. 11 to FIG. 14, the via contact openings VCO are formed during multiple etching steps, e.g., three etching steps. In some embodiments, different conditions are adopted for consecutive etching steps. For example, the first interlayer dielectric material layer 1000a may be etched in first etching conditions, and the upper blanket etch stop layer 920a may be etched in second etching conditions different from the first etching conditions, and so on. The type of etching performed in each step may be chosen according to the material of the layer to be etched. For example, the second interlayer dielectric material layer 1000a may include silicon oxide, which may be etched via ICP or CCP plasma etching. In some embodiments, the plasma may include $CF_4$, CO, $O_2$, Ar, or combinations thereof as etchant. In some embodiments, the plasma power may be in the range from 10 W to 900 W. The bi-layer etch stop layer 900, on the other hand, may include $Si_3N_4$, SiC, SiOC, AlN, or $Al_2O_3$, for example. $Si_3N_4$ may have a SiN base, while no SiN base may be applied for SiC and SiOC. $Si_3N_4$, SiC, and SiOC could be removed by plasma etching with a plasma including $CF_4$, CO, $O_2$, Ar, or combinations thereof, at a plasma power in the range from 10 W to 900 W. In some embodiments, the second interlayer dielectric material layer 1000a may be etched with a first fluoride containing etchant, and the etch stop layer 900 may be etched with a second fluoride containing etchant. The first fluoride containing etchant may differ from the second fluoride containing etchant, for example, in the proportions of its components, or, more generally, in its composition. AlN or $Al_2O_3$ could be removed in a wet clean etching process, for example employing an aqueous etchant including an acid, a chelator, and an amine. In some embodiments, the removal rate of the material of the etched layer in a given etching step is at least two times the removal rate of the directly underlying layer in the same etching conditions. For example, an etching selectivity for the second interlayer dielectric material layer 1000a over the upper blanket etch stop layer 920a in the etching conditions adopted to form the precursor via contact openings VCOa is greater than 16 (a ratio of the respective removal rates may be greater than 16). In some embodiments, an etching selectivity for the upper blanket etch stop layer 920a over the lower blanket etch stop layer 910a in the etching conditions adopted to form the extended via contact openings VCOb is greater than 2 (a ratio of the respective removal rates may be greater than 2). In some embodiments, an etching selectivity for the lower blanket etch stop layer 910a over the capping layer 600 in the etching conditions adopted to form the via contact openings VCO is greater than 10 (a ratio of the respective removal rates may be greater than 10). In some embodiments, by providing the bi-layer etch stop layer 900 as described above, it may be possible to open the via contact openings VCO without damaging the capping layer 600. That is, the metal gate 520 may still be covered by the capping layer 600 even after the via contact openings VCO are formed.

Figure 15:
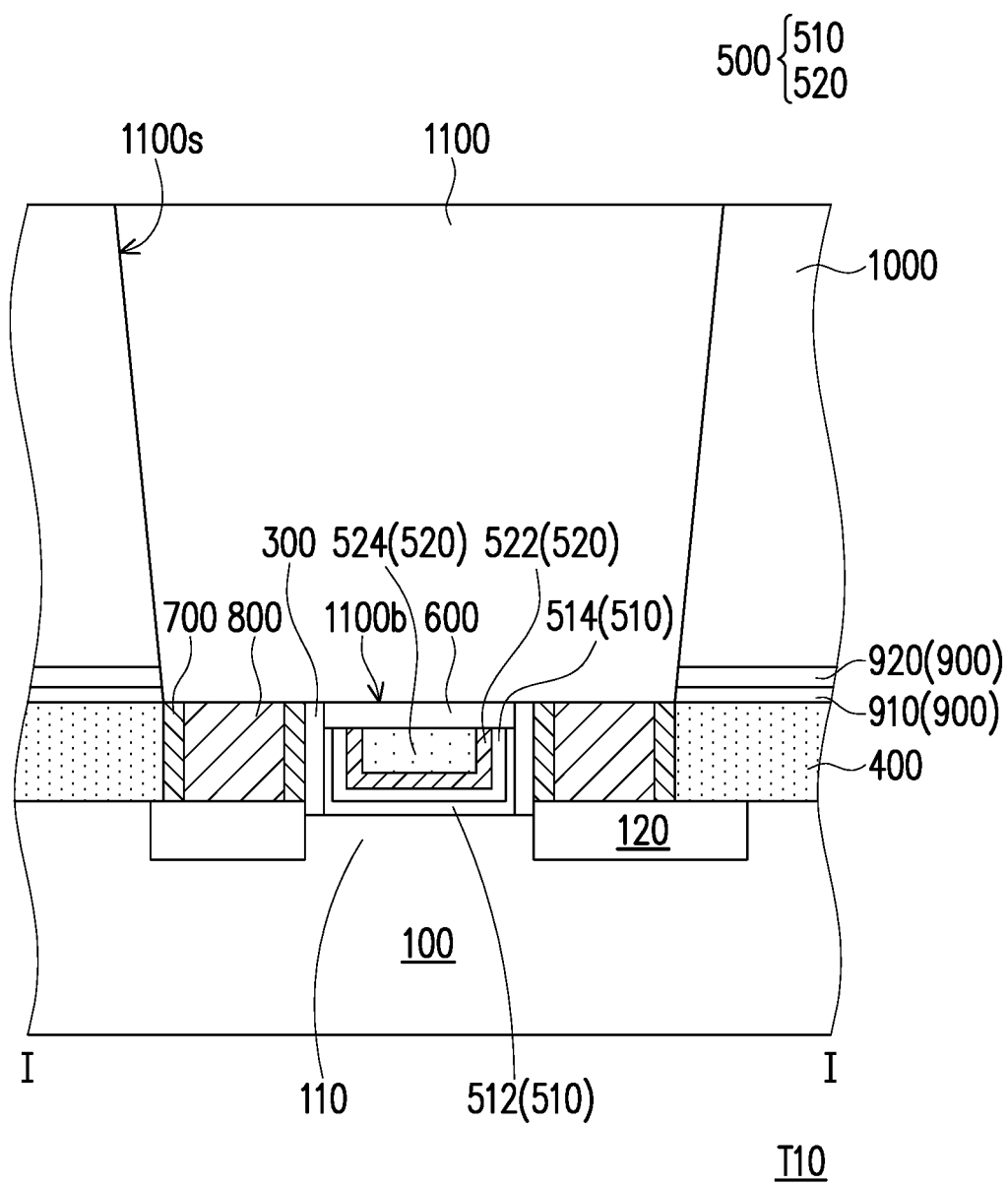

Referring to FIG. 14 and FIG. 15, in some embodiments, upper contacts 1100 may be formed by disposing a conductive material in the via contact openings VCO. In some embodiments, the conductive material of the upper contacts 1100 includes cobalt (Co), tungsten (W), copper (Cu), titanium (Ti), tantalum (Ta), aluminum (Al), zirconium (Zr), hafnium (Hf), titanium nitride (TiN), ruthenium (Ru), a combination thereof, or other suitable metallic materials. In some embodiments, the conductive material of the upper contacts 1100 includes copper. In some embodiments, the conductive material may be formed by using sputtering, chemical vapor deposition (CVD), physical vapor deposition (PVD), atomic layer deposition (ALD), other deposition techniques, or a combination thereof. Even though not illustrated in FIG. 15, in some embodiments, the upper contacts 1100 may include barrier layers, seed layers, and so on. As illustrated in FIG. 15, in the transistor T10 one upper contact 1100 may contact a pair of lower source and drain contacts 800 disposed on the source and drain regions 120 of a same fin 110. The upper contact 1100 may extend through the second interlayer dielectric layer 1000, the upper etch stop layer 920 and the lower etch stop layer 910 and reach the lower source and drain contacts 800 and the capping layer 600. The lower source and drain contacts 800 contacted by the one upper contact 1100 may be disposed at opposite sides of the gate structure 500. As such, the upper contact 1100 may extend over the gate structure 500. The metal gate 520 may be insulated from the upper contact 1100 by the gate dielectric layers 510 and the capping layer 600. In some embodiments, the bottom surface 1100b of the upper contact 1100 partially extends on the lower source and drain contacts 800 and the capping layer 600, while the sidewalls 1100s of the upper contact 1100 physically contact the upper etch stop layer 920 and the lower etch stop layer 910 (as well as the second interlayer dielectric layer 1000). In some embodiments, by providing the bi-layer etch stop layer 900 as described above, it is possible to avoid undesired exposure of the metal gate 520 when forming the via contact openings VCO. That is, it is possible to prevent or reduce damages to the capping layer 600 when the bi-layer etch stop layer 900 is removed to expose the lower source and drain contacts 800. As such, reliability of the transistor T10 may increase, and a failure rate of the manufacturing process may be reduced.

Figure 16:
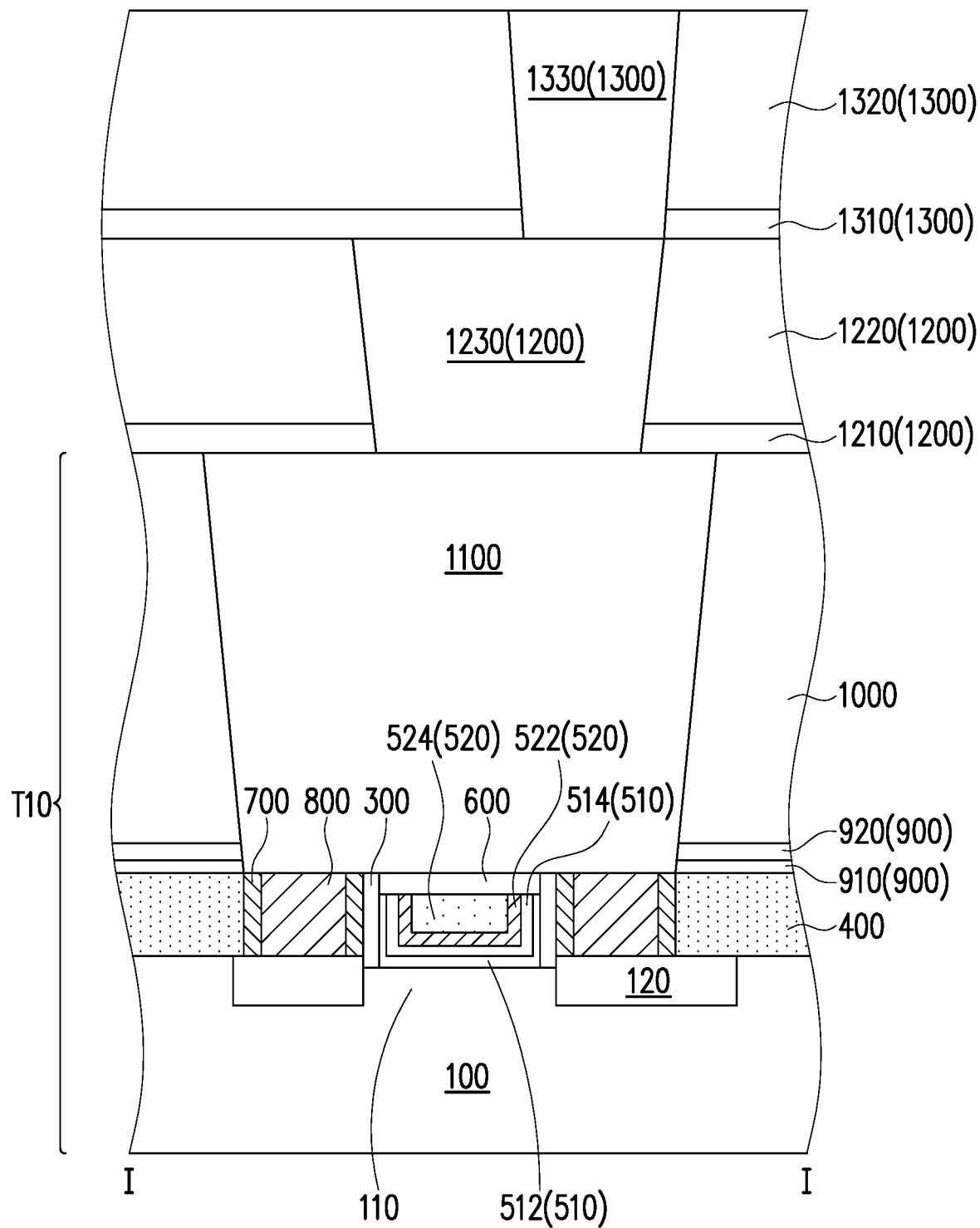
FIG. 16 shows a schematic cross-sectional view of a FinFET integrated in a device according to some embodiments of the disclosure.

In some embodiments, the transistor T10 is integrated in a circuit including other electrical components. In some embodiments, as illustrated in FIG. 16, the transistor T10 is part of a semiconductor device D10, and is interconnected to other components, for example via upper interconnection layers 1200, 1300 which establish electrical contact with the upper contacts 1100. For example, a first interconnection layer 1200 may be formed on the second interlayer dielectric layer 1000 and the upper contacts 1100, and a second interconnection layer 1300 may be formed on the first interconnection layer 1200. The first interconnection layer 1200 may include a second etch stop layer 1210, a third interlayer dielectric layer 1220, and a conductive via 1230. The second etch stop layer 1210 may be formed on the second interlayer dielectric layer 1000 and on part of the upper contact 1100, and the third interlayer dielectric layer 1220 may be stacked on the second etch stop layer 1210. The second etch stop layer 1210 and the third interlayer dielectric layer 1220 may be patterned to expose at least a portion of the upper contacts 1100. The conductive via 1230 may vertically extend through the third interlayer dielectric layer 1220 and the second etch stop layer 1210 to electrically contact the upper contact 1100. Similarly, the second interconnection layer 1300 may include a third etch stop layer 1310 formed on the third interlayer dielectric layer 1220 and at least a portion of the conductive via 1230, and a fourth interlayer dielectric layer 1320 stacked on the third etch stop layer 1310. The second interconnection layer 1300 may further include a conductive via 1330 vertically extending trough the fourth interlayer dielectric layer 1320 and the third etch stop layer 1310 to contact the conductive via 1230. In some embodiments, the etch stop layers 1210, 1310, the interlayer dielectric layers 1220, 1320, and the conductive vias 1230, 1330, may be manufactured employing similar material and processes as previously described for the etch stop layer 900, the second interlayer dielectric layer 1000, and the upper contacts 1100, respectively, and a description thereof is omitted herein for the sake of brevity.

FIG. 17 to FIG. 20 are schematic cross-sectional views of structures produced during a manufacturing process of a transistor T20 according to some embodiments of the disclosure. In some embodiments, the structure illustrated in FIG. 17 may be formed from the structure illustrated in FIG. 9 by forming, in order, the etch stop material layer 902a and the second interlayer dielectric material layer 1000a. A difference between the etch stop material layer 902a of FIG. 17 and the etch stop material layer 900a of FIG. 10 lies in the etch stop material layer 902a being a monolayer. That is, the etch stop material layer 902a of FIG. 17 may include a single blanket etch stop layer, rather than multiple blanket etch stop layers as the etch stop material layer 900a. In some embodiments, the etch stop material layer 902a is disposed between the second interlayer dielectric material layer 1000a and the first interlayer dielectric layer 400, the capping layer 600, the lower source and drain contacts 800, and so on. In some embodiments, the etch stop material layer 902a is formed directly on (in physical contact with) the first interlayer dielectric layer 400, the capping layer 600, and the lower source and drain contacts 800. The etch stop material layer 902a further contacts the lining layers 700 and the gate dielectric layers 510. In some embodiments, the thickness T902 of the lower etch stop material layer 902a is in the range from 20 Angstrom to 100 Angstrom.

The etch stop material layer 902a includes a different material from the capping layer 600 and the second interlayer dielectric material layer 1000a. That is, the material of the etch stop material layer 902a has a different etching behavior than the material of the capping layer 600 and the second interlayer dielectric material layer 1000a. In some embodiments, the material of the capping layer 600 is selected from a first group of materials, and the material of the etch stop material layer 902a is selected from a second group of materials, where the first group of materials and the second group of materials include different compounds or materials having different etching behavior. For example, the first group of materials may include $Si_3N_4$, and the second group of materials may include AlN, $Al_2O_3$, SiC and SiOC. In such cases, the capping layer 600 may include, be made of, or consist of $Si_3N_4$, and the etch stop material layer 902a may include, be made of, or consist of AlN, $Al_2O_3$, SiC, or SiOC. In some alternative embodiments, the first group of materials may include SiC and SiOC, and the second group of materials may include AlN, $Al_2O_3$, and $Si_3N_4$. In such cases, the capping layer 600 and the upper blanket etch stop layer 920a may include, be made of, or consist of SiC or SiOC, and the etch stop material layer 902a may include, be made of, or consist of AlN, $Al_2O_3$ or $Si_3N_4$. In some embodiments, the etch stop material layer 902a does not include the same material included in the capping layer 600. For example, if the etch stop material layer 902a includes SiC, the capping layer 600 does not include SiC, and so on. In some embodiments, the etch stop material layer 902a may be formed by suitable deposition processes, for example via ALD or PECVD. In some embodiments, the deposition technique may be selected in function of the material used, similar to what was previously discussed with reference to FIG. 10. In some embodiments, the second interlayer dielectric material layer 1000a may be formed as previously described with reference to FIG. 11.

Figure 17:
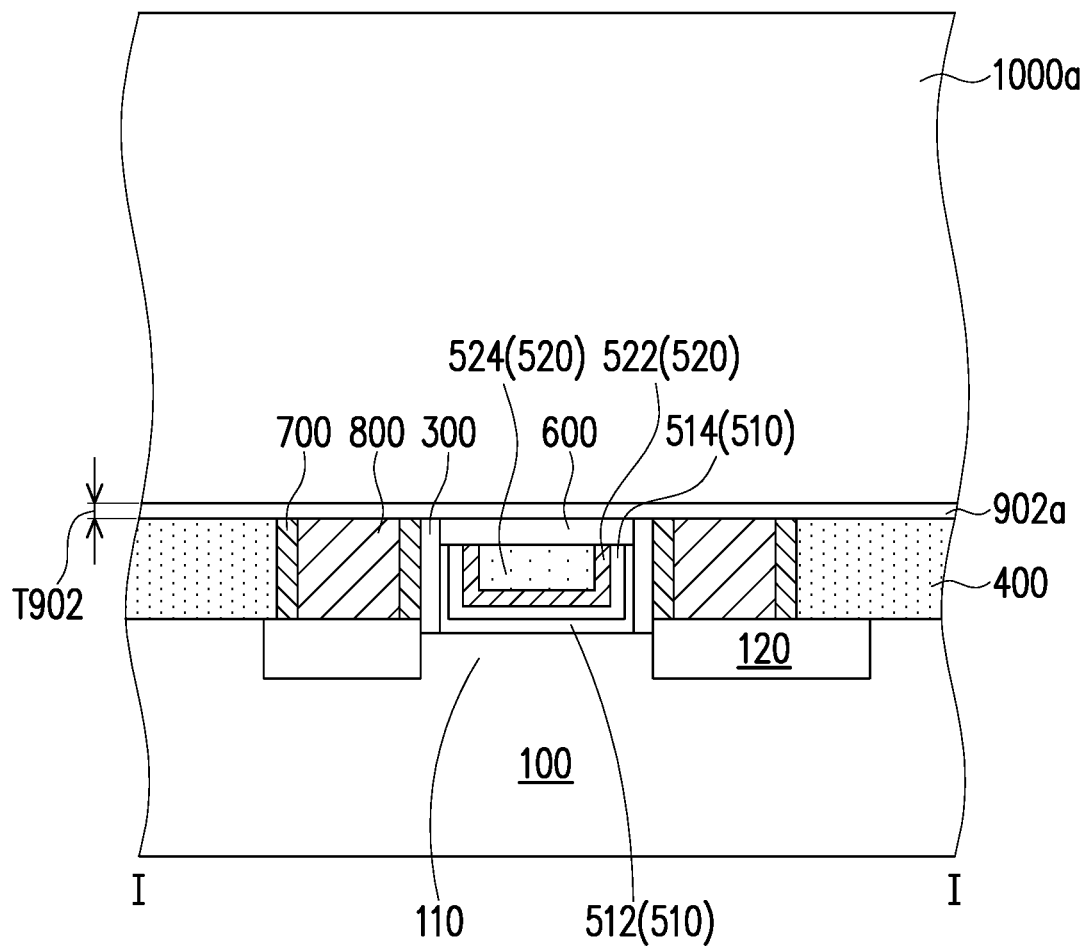
FIG. 17 to FIG. 20 show schematic cross-sectional views of structures produced during a manufacturing method of a FinFET according to some embodiments of the disclosure.
Figure 18:
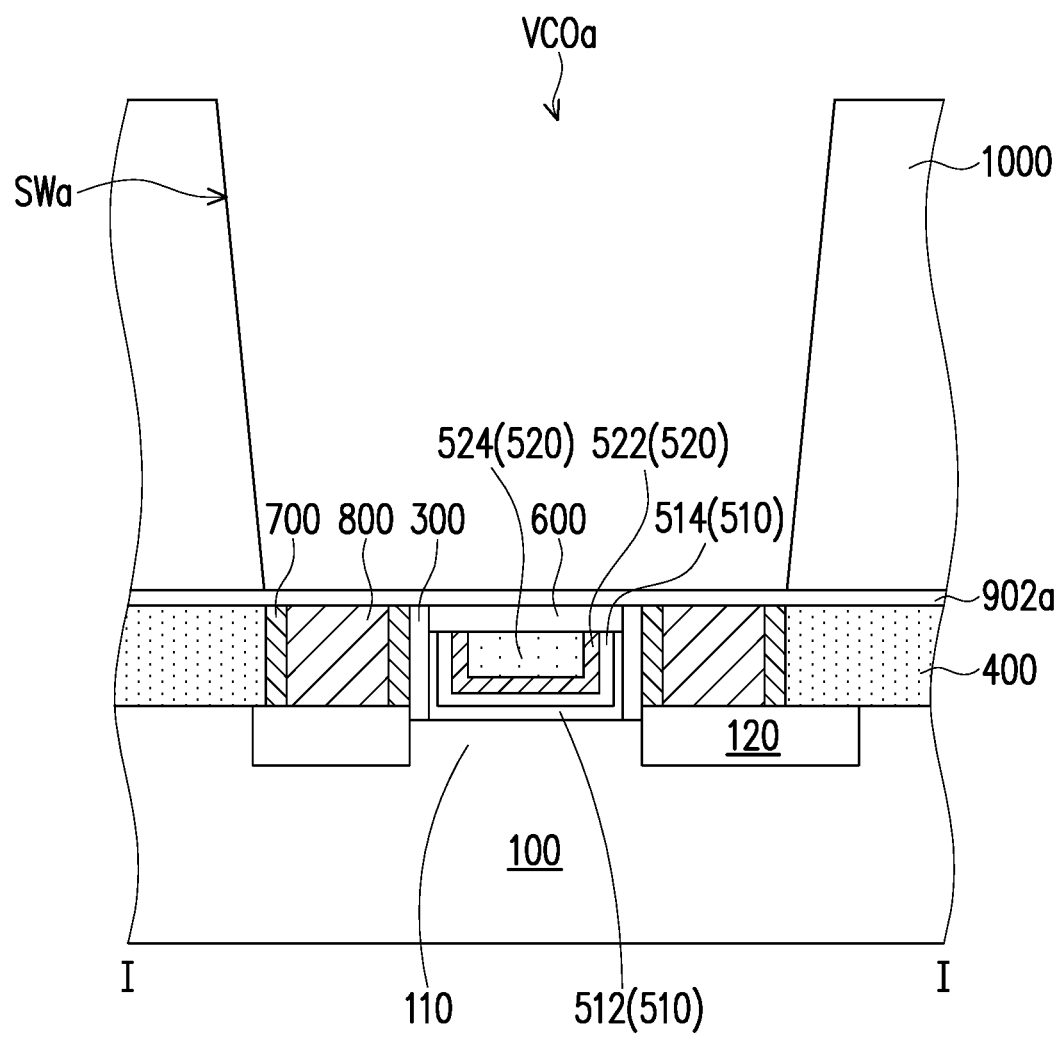

Referring to FIG. 17 and FIG. 18, the second interlayer dielectric material layer 1000a is patterned to form the second interlayer dielectric layer 1000 including precursor via contact openings VCOa. In some embodiments, the precursor via contact openings VCOa vertically extend through the second interlayer dielectric layer 1000 to expose portions of the etch stop material layer 902a. In some embodiments, the sidewalls SWa of the precursor via contact openings VCOa may be tapered. That is, the precursor via contact openings VCOa may become narrower moving towards the etch stop material layer 902a. In some embodiments, the precursor via contact openings VCOa may be formed by removing portions of the second interlayer dielectric material layer 1000a, for example during an etching step. In some embodiments, the material of the second interlayer dielectric material layer 1000a may be selectively etched with respect to the material of the etch stop material layer 902a. That is, the material of the second interlayer dielectric material layer 1000a may have a different etching behavior with respect to the material of the etch stop material layer 902a. For example, the thickness T902 (illustrated in FIG. 17) of the etch stop material layer 902a after the etching step in which the precursor via contact openings VCOa are opened may be within 70% to 100% of the thickness T902 before the same etching step. For example, the etch stop material layer 902a may lose up to about 30% of its original thickness T902 following etching of the second interlayer dielectric material layer 1000a. In some embodiments, an etching selectivity for the second interlayer dielectric material layer 1000a over the etch stop material layer 902a is greater than 16. The etch stop material layer 902a may protect the underlying layers (e.g., the capping layer 600 and so on), during the etching of the second interlayer dielectric material layer 1000a.

Figure 19:
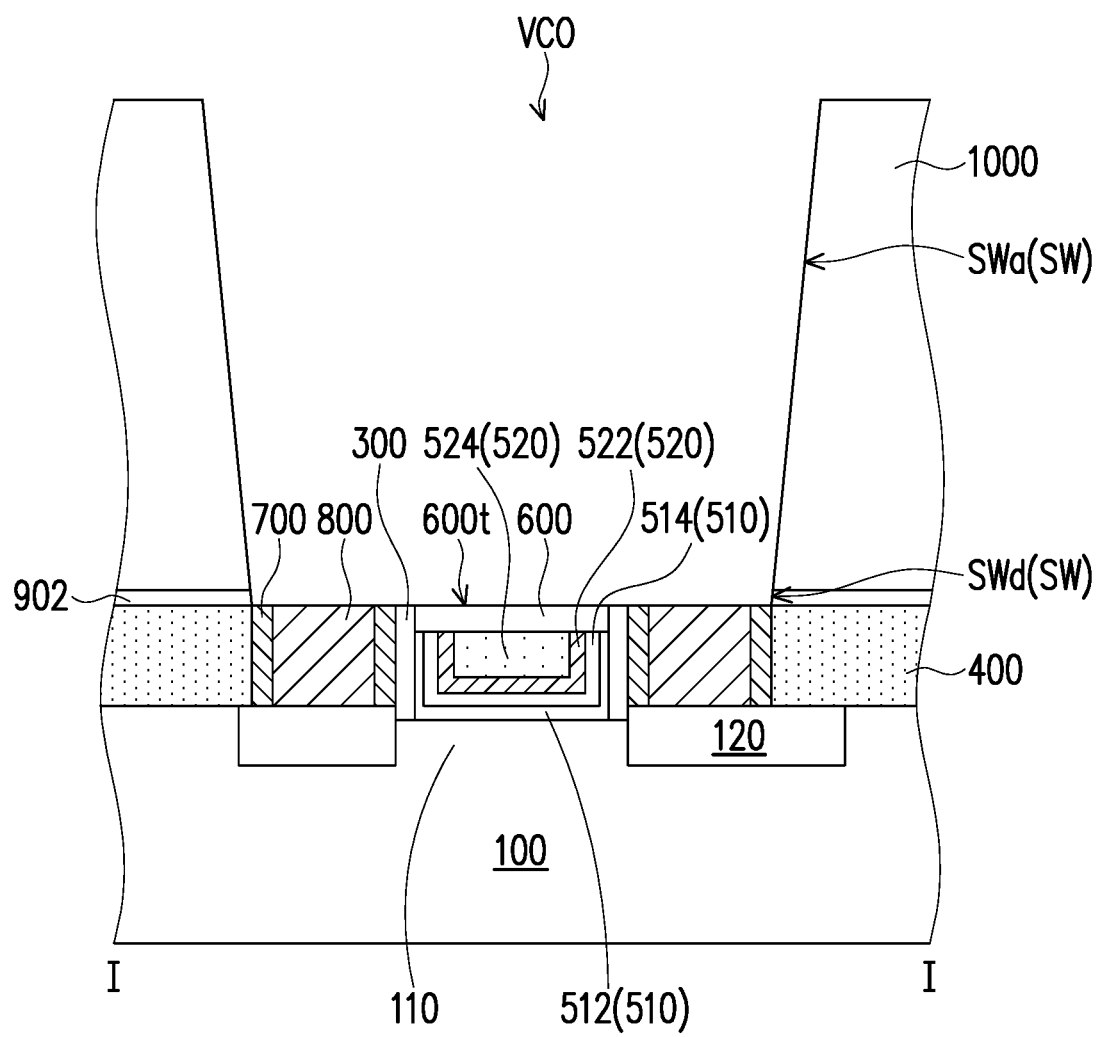

Referring to FIG. 18 and FIG. 19, the precursor via contact openings VCOa may be extended through the etch stop material layer 902a to form the via contact openings VCO. The resulting via contact openings VCO expose at their bottom the capping layer 600 and the lower source and drain contacts 800. The gate dielectric layers 510, the spacers 300 and some of the lining layers 700 may also be exposed by the via contact openings VCO. After the precursor via contact openings VCOa are extended, the etch stop layer 902 remains between the first interlayer dielectric layer 400 and second interlayer dielectric layer 1000. That is, the portion of the etch stop material layer 902a extending on the capping layer 600 and the lower source and drain contacts 800 may be removed, while the portions of etch stop material layer 902a which are covered by the second interlayer dielectric layer 1000 may be retained even after the via contact openings VCO are formed. As such, the via contact openings VCO open through the second interlayer dielectric layer 1000 and the etch stop layer 902. In some embodiments, because the etch stop layer 902 is a monolayer etch stop layer, the sidewalls SW of the via contact openings VCO include only two sections, a first section SWa formed by the second interlayer dielectric layer 1000 and a second section SWd formed by the etch stop layer 902. In some embodiments, the sections SWa and SWd may have the same inclination (may be inclined at a same tapering angle) with respect to the top surface 600t of the capping layer 600. That is, the profile of the sidewalls SW may be substantially continuous (straight, albeit not necessarily vertical or normal to the top surface 600t). In some alternative embodiments, the tapering angle of the sections SWa and SWd may vary, and the overall profile of the sidewalls SW may be bent at the interfaces between the second interlayer dielectric layer 1000 and the etch stop layer 902. In some embodiments, the material selected for the etch stop material layer 902a has a different etching behavior than the material selected for the capping layer 600. As such, when the etch stop material layer 902a is etched, the capping layer 600 remains substantially undamaged. That is, the capping layer 600 does not lose more than 1% of its original thickness T600 after the etching of the etch stop material layer 902a. In some embodiments, the thickness T600 of the capping layer after the etching of the etch stop material layer 902a is about 99% of the thickness T600 before the same etching step. Alternatively stated, the material of the etch stop material layer 902a is suitable to be removed in etching conditions in which the material of the capping layer 600 is not removed. In some embodiments, an etching selectivity for the etch stop material layer 902a over the capping layer 600 in the etching conditions adopted to pattern the etch stop material layer 902a is greater than 10 (a ratio of the corresponding etch removal rates is greater than 10).

Figure 20:
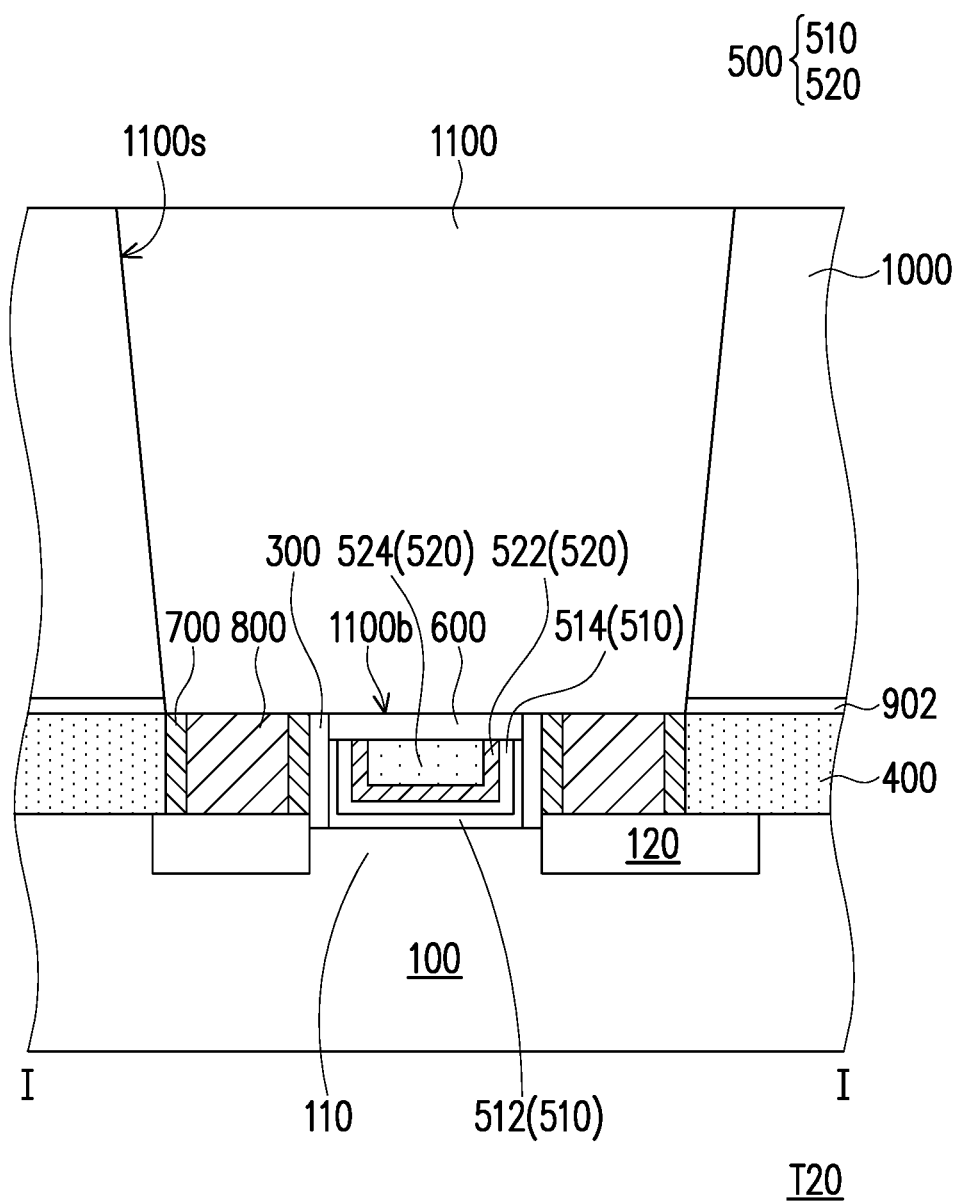

As described above with reference to FIGS. 17 to 19, the via contact openings VCO are formed during multiple etching steps, e.g., two etching steps. The type of etching performed in each step may be chosen according to the material of the layer to be etched, similar to what was previously discussed with reference to FIG. 11 to FIG. 14. In some embodiments, by providing the monolayer etch stop layer 902 as described above including a material with a different etching behavior than the capping layer 600, it may be possible to open the via contact openings VCO without substantially damaging the capping layer 600. That is, the metal gate 520 may still be covered by the capping layer 600 even after the via contact openings VCO are formed. Referring to FIG. 19 and FIG. 20 in some embodiments, upper contacts 1100 may be formed by disposing a conductive material in the via contact openings VCO, similar to what was previously discussed with reference to FIG. 15. In the transistor T20 one upper contact 1100 may contact a pair of lower source and drain contacts 800 disposed on the source and drain regions 120 of a same fin 110. The upper contact 1100 may extend through the second interlayer dielectric layer 1000 and the upper etch stop layer 902 to reach the lower source and drain contacts 800 and the capping layer 600. The lower source and drain contacts 800 contacted by the one upper contact 1100 may be disposed at opposite sides of the gate structure 500. As such, the upper contact 1100 may extend over the gate structure 500. The metal gate 520 may be insulated from the upper contact 1100 by the gate dielectric layers 510 and the capping layer 600. In some embodiments, the bottom surface 1100b of the upper contact 1100 partially extends on the lower source and drain contacts 800 and the capping layer 600, while the sidewalls 1100s of the upper contact 1100 physically contact the etch stop layer 902 as well as the second interlayer dielectric layer 1000. In some embodiments, by providing the monolayer etch stop layer 902 as described above, it is possible to avoid undesired exposure of the metal gate 520 when forming the via contact openings VCO. That is, it is possible to prevent or reduce damages to the capping layer 600 when the etch stop layer 902 is removed to expose the lower source and drain contacts 800. As such, reliability of the transistor T20 may increase, and a failure rate of the manufacturing process may be reduced.

According to some embodiments, a field effect transistor includes a semiconductor substrate, source and drain regions, lower source and drain contacts, a metal gate, a first interlayer dielectric layer, a capping layer, and an etch stop layer. The source and drain regions are disposed on the semiconductor substrate. The lower source and drain contacts are disposed on the source and drain regions. The metal gate is disposed in between the lower source and drain contacts. The first interlayer dielectric layer encircles the metal gate and the lower source and drain contacts. The capping layer is disposed on the metal gate. The etch stop layer extends on the first interlayer dielectric layer. An etching selectivity for the etch stop layer over the capping layer is greater than 10.

According to some embodiments, a manufacturing method of a field effect transistor includes the following steps. A metal gate is provided. The metal gate is disposed in between lower source and drain contacts over a semiconductor substrate and is encircled by a first interlayer dielectric layer. A capping layer is formed on the metal gate. An etch stop layer is formed. The etch stop layer extends on the first interlayer dielectric layer, the capping layer and the lower source and drain contacts. Portions of the etch stop layer extending on the capping layer and the lower source and drain contacts are removed without substantially damaging the capping layer.

According to some embodiments, a method of manufacturing a field effect transistor includes the following steps. A metal gate is provided. The metal gate is disposed in between lower source and drain contacts over a semiconductor substrate. The metal gate and the lower source and drain contacts are surrounded by a first interlayer dielectric layer. A capping layer is formed on the metal gate. The capping layer includes a first material. An etch stop layer is formed. The etch stop layer extends on the first interlayer dielectric layer, the capping layer and the lower source and drain contacts. The etch stop layer includes a second material different from the first material. A second interlayer dielectric layer is formed on the etch stop layer. The second interlayer dielectric layer extends over the first interlayer dielectric layer, the capping layer, and the lower source and drain contacts. An opening is formed in the second interlayer dielectric layer over the capping layer and the lower source and drain contacts. A portion of the etch stop layer exposed by the opening is removed. The first material is selected from the group consisting of silicon nitride, silicon carbide, and silicon oxycarbide, and the second material is selected from the group consisting of aluminum nitride, aluminum oxide, silicon carbide, silicon oxycarbide, and silicon nitride, wherein if the first material is silicon carbide or silicon oxycarbide, the second material is not silicon oxycarbide or silicon carbide, respectively.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A field effect transistor, comprising:
   a semiconductor substrate;
   source and drain regions, disposed on the semiconductor substrate;
   lower source and drain contacts, disposed on the source and drain regions;
   a metal gate, disposed in between the lower source and drain contacts;

a first interlayer dielectric layer, encircling the metal gate and the lower source and drain contacts;

a capping layer, disposed on the metal gate; and an etch stop layer, extending on the first interlayer dielectric layer;

wherein an etching selectivity for the etch stop layer over the capping layer is greater than 10, and wherein top surfaces of the first interlayer dielectric layer, the capping layer, and the lower source and drain contacts are level.

2. The field effect transistor according to claim 1, wherein the etch stop layer is a monolayer etch stop layer.

3. The field effect transistor of claim 1, further comprising an upper contact extending on the lower source and drain contacts and the capping layer, wherein the upper contact passes through the etch stop layer.

4. The field effect transistor according to claim 1, wherein the capping layer includes silicon nitride, silicon carbide or silicon oxycarbide.

5. The field effect transistor according to claim 4, wherein the etch stop layer includes aluminum nitride, aluminum oxide, silicon carbide, silicon oxycarbide or silicon nitride.

6. The field effect transistor according to claim 1, further comprising a second interlayer dielectric layer disposed on the etch stop layer, and an etching selectivity for the second interlayer dielectric layer over the etch stop layer is greater than 16.

7. The field effect transistor according to claim 6, wherein the etch stop layer is a bi-layer etch stop layer, including a lower etch stop layer disposed on the first interlayer dielectric layer and an upper etch stop layer disposed between the lower etch stop layer and the second interlayer dielectric layer, wherein the lower etch stop layer has the etching selectivity greater than 10 with respect to the capping layer, and the upper etch stop layer includes the same material of the capping layer.

8. A manufacturing method of a field effect transistor, comprising:

providing a metal gate, wherein the metal gate is disposed in between lower source and drain contacts over a semiconductor substrate and is encircled by a first interlayer dielectric layer;

forming a capping layer on the metal gate;

forming an etch stop material layer extending on level top surfaces of the first interlayer dielectric layer, of the capping layer, and of the lower source and drain contacts; and removing portions of the etch stop material layer extending on the capping layer and the lower source and drain contacts without substantially damaging the capping layer, wherein a thickness of the capping layer after the portions of the etch stop material layer are removed is within 90% of a thickness of the capping layer before the portions of the etch stop material layer are removed.

9. The manufacturing method of claim 8, wherein the capping layer loses at most 1% of its thickness when the portions of the etch stop material layer are removed.

10. The manufacturing method according to claim 8, wherein the portions of the etch stop material layer are removed via one of plasma etching employing a fluoride containing etchant or a wet clean process, and a material of the capping layer resists removal conditions of the portions of the etch stop material layer.

11. The manufacturing method of claim 10, wherein the material of e capping layer includes silicon nitride.

12. The manufacturing method of claim 11, wherein the etch stop material layer includes aluminum nitride, aluminum oxide, silicon carbide, or silicon oxycarbide.

13. The manufacturing method of claim 10, wherein the material of the capping layer includes silicon carbide or silicon oxycarbide.

14. The manufacturing method of claim 13, wherein the etch stop material layer includes aluminum nitride, aluminum oxide or silicon nitride.

15. A manufacturing method of a field effect transistor, comprising:

providing a metal gate, wherein the metal gate is disposed in between lower source and drain contacts over a semiconductor substrate, and the metal gate and the lower source and drain contacts are surrounded by a first interlayer dielectric layer;

forming a capping layer on the metal gate, the capping layer including a first material;

forming an etch stop material layer extending on the first interlayer dielectric layer, the capping layer and the lower source and drain contacts, the etch stop material layer including a second material different from the first material;

forming a second interlayer dielectric material layer on the etch stop material layer, extending over the first interlayer dielectric layer, the capping layer, and the lower source and drain contacts;

forming an opening in the second interlayer dielectric material layer over the capping layer and the lower source and drain contacts;

removing a portion of etch stop material layer exposed by the opening; and disposing a conductive material on the capping layer exposed at the bottom of the opening by removal of the portion of etch stop material layer, wherein the first material is selected from the group consisting of silicon nitride, silicon carbide, and silicon oxycarbide, and the second material is selected from the group consisting of aluminum nitride, aluminum oxide, silicon carbide, silicon oxycarbide, and silicon nitride, wherein when the first material is silicon carbide or silicon oxycarbide, the second material is not silicon oxycarbide or silicon carbide, respectively.

16. The manufacturing method of claim 15, wherein the etch stop material layer is a monolayer etch stop material layer including the second material.

17. The manufacturing method of claim 15, further comprising filling the opening with the conductive material.

18. The manufacturing method according to claim 15, wherein forming the etch stop material layer comprises forming, in sequence, a lower blanket etch stop layer and an upper blanket etch stop layer, and the lower blanket etch stop layer includes the second material.

19. The manufacturing method of claim 18, wherein the upper blanket etch stop layer includes the first material.

20. The manufacturing method of claim 18, wherein portions of the upper blanket etch stop layer and the lower blanket etch stop layer are removed under different process conditions.

* * * * *